United States Patent
Bradley

(10) Patent No.: US 8,410,786 B1
(45) Date of Patent: Apr. 2, 2013

(54) PASSIVE INTERMODULATION (PIM) DISTANCE TO FAULT ANALYZER WITH SELECTABLE HARMONIC LEVEL

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 152 days.

(21) Appl. No.: 13/156,177

(22) Filed: Jun. 8, 2011

Related U.S. Application Data

(63) Continuation-in-part of application No. 12/723,259, filed on Mar. 12, 2010, now Pat. No. 8,294,469, which is a continuation-in-part of application No. 12/246,330, filed on Oct. 6, 2008, now Pat. No. 8,058,880.

(51) Int. Cl.
*G01R 31/08* (2006.01)
(52) U.S. Cl. .................................. 324/520; 324/650
(58) Field of Classification Search .............. 324/420, 324/620

See application file for complete search history.

(56) References Cited

U.S. PATENT DOCUMENTS 5,729,145 A * 3/1998 Blades ................ 324/536

* cited by examiner

*Primary Examiner* — Vincent Q Nguyen

(57) ABSTRACT

A distance to PIM measurement circuit is made using a device such as an AWS transceiver that has separate transmit and receive bands. With a typical AWS transceiver placed in close proximity to a PCS transceiver, the AWS device will include a band reject filter to eliminate interference from the PCS signals. The PIM measurement circuit includes two frequency sources F1 and F2 that are provided through a combiner for characterization of the PIM circuit. To enable distance determination, an FM measurement is created by using a offset sweep generator attached to one of the two frequency sources. To avoid frequencies blocked by the band reject filter, a desired harmonic of a test PIM harmonic signal is selected outside the band of the band reject filter. In one embodiment, a reference signal is provided by mixing a signal from an xM multiplier connected to the F1 source with an xN multiplier signal connected to the F2 source, the mixed output being filtered to select the desired harmonic reference signal to avoid the band reject filter. In another embodiment, a reference signal is created by generating all harmonics of the combined F1 and F2 signal using a series connected amplifier and clipping diodes with a filter again used to select the desired harmonic reference signal to avoid the band reject filter.

9 Claims, 18 Drawing Sheets

PASSIVE INTERMODULATION (PIM) DISTANCE TO FAULT ANALYZER WITH SELECTABLE HARMONIC LEVEL

CLAIM FOR PRIORITY

This application is a continuation-in-part of application Ser. No. 12/723,259 filed on Mar. 12, 2010, entitled "Passive Intermodulation (PIM) Distance to Fault Analyzer with Selectable Harmonic Level", which is a continuation-in-part of Ser. No. 12/246,330 filed on Oct. 6, 2008, entitled "Calibrated Two Port Passive Intermodulation (PIM) Distance to Fault Analyzer," the entire contents of which are incorporated herein by reference.

BACKGROUND

1. Technical Field

The present invention relates to a single (reflected) or a two port (transmission) distance to fault analyzer configured to measure passive intermodulation (PIM) created by two separate signal sources as well as to measure distance to a fault creating PIM.

2. Related Art

PIM is an unwanted signal or signals generated by the non-linear mixing of two or more frequencies in a passive device such as a connector or cable. PIM has surfaced as a problem for cellular telephone technologies such as Global System for Mobile Communications (GSM), Advanced Wireless Service (AWS) and Personal Communication Service (PCS) systems. Cable assemblies connecting a base station to an antenna on a tower using these cellular systems typically have multiple connectors that cause PIMs that can interfere with system operation.

The PIM signals are created when two signals from different systems combine and are then reflected at a PIM point such as a faulty cable connector. If the generated PIM harmonic frequency components fall within the receive band of a base station, it can effectively block a channel and make the base station receiver think that a carrier is present when one is not. Generally the components of concern are $3^{rd}$, $5^{th}$ and $7^{th}$ order where the third order is of greatest signal strength, and therefore, of primary concern. PIMs can, thus, occur when two base stations operating at different frequencies, such as an AWS device and a PCS device, are in close proximity.

The PIMs can be reduced or eliminated by replacing faulty cables or connectors. Test systems are thus utilized to detect the PIMs enabling a technician to locate the faulty cable or connector. The test system to measure the PIMs, thus, creates signals at two different frequencies, amplifies them, and provides them through cables connecting a base station to antennas on a tower for the base stations. A return signal carrying the PIMs is filtered to select a desired test frequency harmonic where PIMs can be detected, and the PIM and distance to PIM measurement is provided to an operator.

FIG. 1 shows a block diagram of components of a prior art test system setup for measuring PIM. The test system utilizes two signal sources 2 and 4, with a first signal source 2 producing a signal at frequency F1 and the second signal source 4 producing a signal at frequency F2. When these multiple signals are allowed to share the same signal path in a nonlinear transmission medium, the unwanted signals can occur. The $3^{rd}$ order response is particularly troublesome as it produces signals at 2F1-F2 as well as 2F2-F1.

In the system of FIG. 1, the signal sources 2 and 4 are provided through high power amplifiers (HPAs) 6 and 8 and isolators 10 and 12 to a hybrid combiner 14 to create a combined signal with frequencies F1 and F2 at the hybrid combiner 14 output. The duplexer 16 sends the signals F1 and F2 to the test port P1. A reverse or reflected signal from port P1 is then produced at frequency 2F1-F2, and forwarded through duplexer 16 to switch 18. The switch 18 in the receive (R) position provides the signal 2F1-F2 through an amplifier 20 to a digital receiver or spectrum analyzer 22 for measurement. The port P1 can be connected by cable to port P2 and switch 18 switched over to make a transmission (T) measurement. With the transmission measurement, signals are provided at F1 and F2 with mixing products at 2F1-F2 to port P2. The duplexer 26 provides the signals F1 and F2 to termination 24, while the signal 2F1-F2 is provided from duplexer 26 through switch 18 and amplifier 20 to the digital receiver or spectrum analyzer 22 for measurement.

FIG. 2 shows an example of actual frequencies used when measuring a load with the test system setup of FIG. 1. Components carried over from FIG. 1 to FIG. 2 are similarly labeled, as will be components carried over in subsequent figures. The two signals F1 and F2 and how they create a third interfering signal can be explained using an example measurement setup with two distinct transmitters, a PCS Band transmitter 2 transmitting at F1=1930 MHz and an AWS Band transmitter 4 transmitting at F2=2127.5 MHz. The PIM produced signal, which can be the result of reflection from a corroded connector or antenna in the transmission path, is simulated by PIM source 30 attached to port P1. It is unknown where an actual PIM or multiple PIM sources may be located. This can be especially troubling when multiple connectors are involved as can be present in a PCS/AWS site tower. But, the PIM source 30 in combination with its connecting cable and load can be designed to simulate reflection from at least one connector.

The PIM source 30 generates a signal at 2×1930−2127.5=1732.5 MHz that is in the receive Band of the AWS system 4. A signal is produced at 2F2-F1=2325 MHz, as also shown in FIG. 2, but since that signal is outside the transmit or receive band of either transmitter 2 and 4, it is not relevant to the present measurement. The two signals transmitted from sources 2 and 4 produce about 40 watts of power for each carrier or +46 dBm each. The resulting PIM signal is on the order of −100 dBm.

The receive channel of the AWS source 4 in an actual operating environment can be desensitized by this interfering signal due to the broadband noncorrelated characteristic of the modulation present on both transmit carriers spreading the power over the entire receive channel. DIN 7-16 coax cable connectors typically have PIM values on the order of −140 to −168 dBc. The PIM measurement, thus, must detect signals that are <−146 dBc. Since the desired PIM signal to be measured is the 1732.5 MHz signal, the bandpass filter 32 with center frequency of 1732.5 is used to filter out other signal components and provide the PIM signal for measurement to the digital receiver or spectrum analyzer 22. An exemplary digital receiver or spectrum analyzer 22 used to perform the test can be a Summitek Instruments Model S12000D Passive Intermodulation Analyzer in the D configuration or a Telstra PIMT2V2 low power PIM Tester.

A problem with current test systems is that when an AWS system and a PCS system are in close proximity, a filter is provided in the AWS system to remove PCS components. The band reject filter will eliminate the 1732.5 MHz PIM test signal that is being measured by the system of FIG. 1, as described above, so testing for $3^{rd}$ order signals cannot be accomplished. Testing for higher order signals such as $5^{th}$, $7^{th}$ or other higher orders will be outside the receive bandwidth of the conventional tester.

SUMMARY

Embodiments of the present invention provide a distance to PIM measurement circuit made using a device such as an AWS transceiver that has separate transmit and receive bands, with the AWS transceiver placed in close proximity to another device such as a PCS transceiver, where a band reject filter is used in the AWS device to eliminate interference from the PCS signals. The distance to PIM measurement circuit specifically allows selection of a high harmonic signal to accomplish test measurements so that signals are not blocked by the band reject filter.

In embodiments of the invention, the distance to PIM measurement circuit includes two frequency sources F1 and F2 that are provided through a combiner for a CW characterization of the PIM circuit. To enable distance determination, an FM measurement is created by using a saw tooth offset sweep generator attached to one of the two frequency sources operating at a significantly lower frequency than the frequency source. With downconversion and processing of a selected harmonic signal from the PIM circuit, the FM signal provides a frequency variation that is converted using a Fourier transform to time domain, enabling determination of the distance and magnitude of the PIM source.

To avoid frequencies being blocked by the band reject filter, in one embodiment a filter is used to select a harmonic of a test signal provided from the combined F1 and F2 signal, the selected harmonic avoiding signals within the band reject filter frequency range. A reference signal is then provided by mixing a signal from a times M (xM) multiplier connected to the F1 source and a times N (xN) multiplier connected to the F2 source, and the mixed output is then filtered to select the desired harmonic reference signal. The values of M and N are selected to create the selected harmonic for the reference signal that matches the harmonic chosen for the test signal.

In another embodiment, a filter is again used to select a harmonic of a test signal provided from the combined F1 and F2 signals, the selected harmonic avoiding signals within the band reject frequency range. The reference signal is created, however, in a different manner in this embodiment. The reference signal is created by generating all harmonics of the combined F1 and F2 signal with a filter selecting the desired harmonic reference signal. In one manner the reference signal with all harmonics is created using a series connected amplifier and clipping diodes connected between the F1 and F2 signal combiner and the reference signal harmonic selection filter. In another manner the reference signal is created using a series connected amplifier and a step recovery diode (SRD) connected between the combined F1 and F2 signal and the reference signal harmonic selection filter.

BRIEF DESCRIPTION OF THE DRAWINGS

Further details of the present invention are explained with the help of the attached drawings in which.

DETAILED DESCRIPTION

I. Third Order Harmonic Distance to Fault Analyzer

Initially systems are described that can detect distance to PIM using a $3^{rd}$ order harmonics. Systems that allow detection of harmonics higher than a $3^{rd}$ order are described in a subsequent section II.

Figure 1:
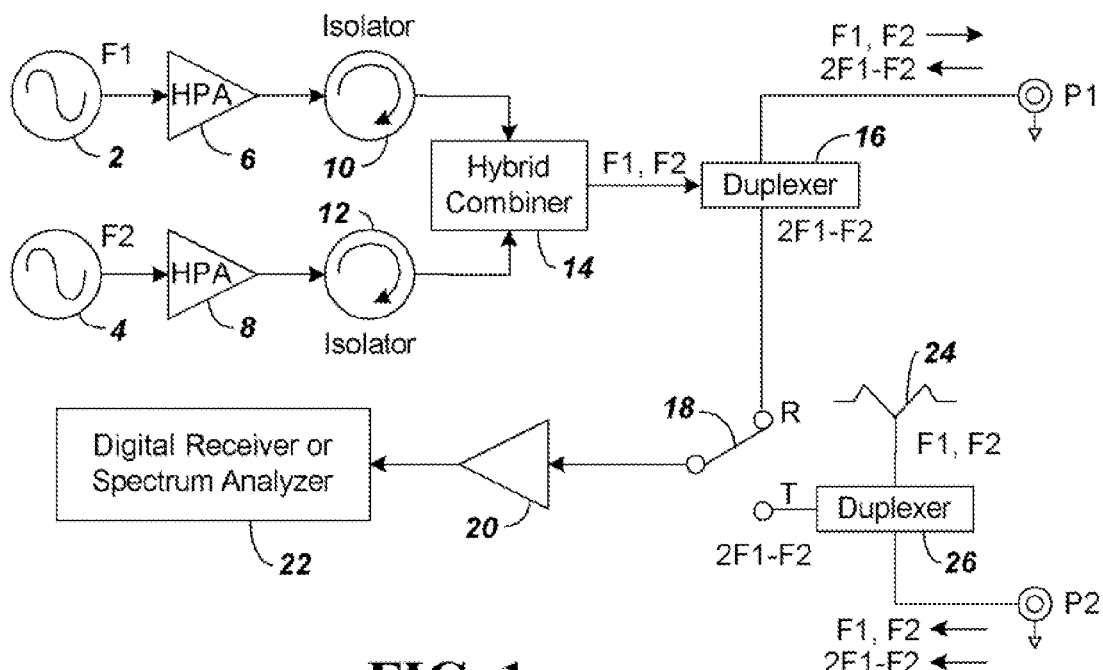
FIG. 1 shows a block diagram of components of a prior art test system setup for measuring passive intermodulation (PIM)
Figure 2:
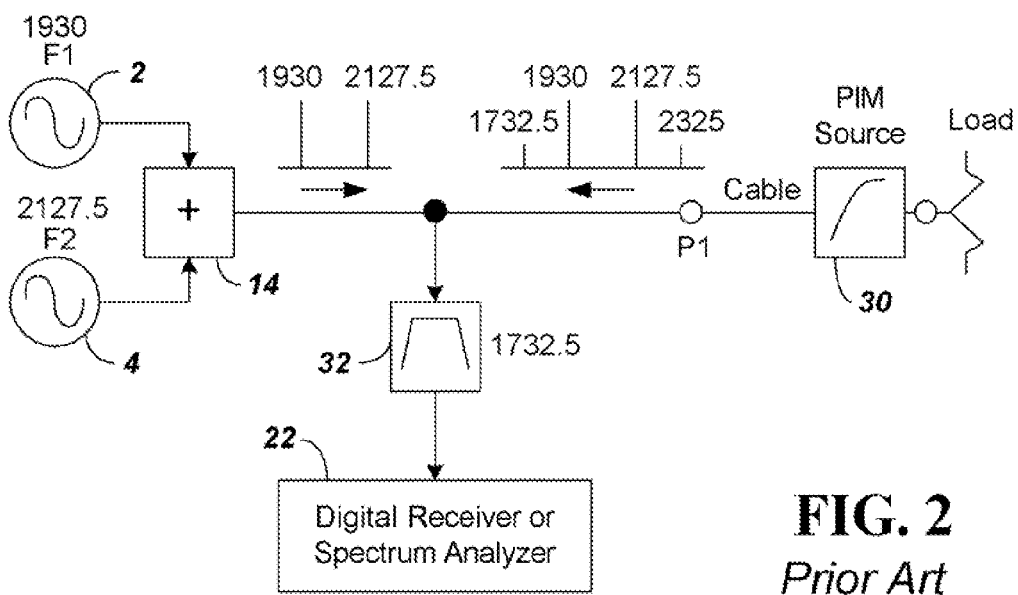
FIG. 2 shows an example of actual frequencies used when measuring a load with the test system setup of FIG. 1.
Figure 3:
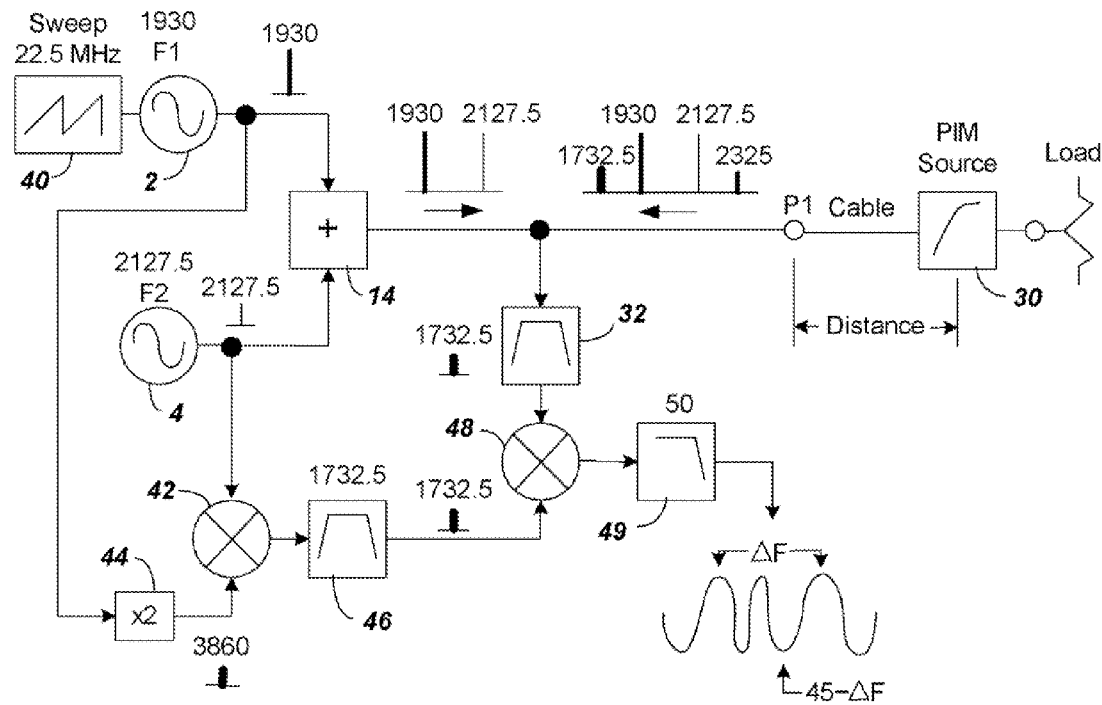
FIG. 3 shows the block diagram of components of a distance to fault analyzer using FM-CW as a means of determining distance with a PIM measurement device.

FIG. 3 shows the block diagram of components of a first distance to fault analyzer using FM-CW and a $3^{rd}$ order signal as a means of determining distance in a PIM measurement device. The FM sweep is introduced using sweep generator 40. The sweep generator 40 is connected to F1 source 2. For purpose of illustration, the sweep generator 40 is shown creating a 1.4844 uS period saw tooth causing a +/−11.25 MHz modulation (ranging 22.5 MHz as shown) that is added to F1 of source 2. The FM sweep signal F1 and the fixed signal F2 when modified by the PIM source will produce the additional signals 2*(F1+FM)−F2 and 2*F2−(F1+FM). The delayed in time (distance) signal 2*(F1+FM)−F2 will be mixed with an internally generated non-delayed in time (distance) signal 2*(F1+FM)−F2 to produce the desired measurement signal ΔF. The ΔF signal represents 68597×distance in feet. The distance to fault from P1 can, thus, be determined by distance in feet=ΔF/68597

The circuitry of FIG. 3 has components added to accomplish addition of the sweep generator frequency and then downconversion of the output signal for analysis. To provide a signal source for downconversion, the circuitry includes a x2 frequency multiplier 44 connected to the F1 source 1930 to provide a 3860 MHz output with a +/−22.5 MHz sweep. The output of the x2 frequency multiplier 44 is provided to a first input of a newly added mixer 42. The second input of mixer 42 is provided from the F2 signal generator 4, so that the output of mixer 42 provides a frequency 3680−2127.5=1732.5 MHz. Bandpass filter 46 centered at 1732.5 MHz eliminates other mixing products from mixer 42 to provide a first input to downconverting mixer 48. A second input of mixer 48 provides the reflected test signal at 1732.5 MHz from bandpass filter 32. With both inputs of mixer 48 at 1732.5 MHz, they are downconverted at the output of mixer 48, leaving substantially only the frequency deviation ΔF due to reflection of a test signal created by the PIM source 30. A lowpass filter 49 removes mixing products higher than 50 MHz, leaving only the forward trace sweep ΔF and retrace sweep signal 45 MHz=ΔF. Measurement of ΔF with a digital receiver using Fourier transform to time domain or a spectrum analyzer gives a measurement of total distance from port P1 to the PIM source using the formula Distance in feet=ΔF/68597, with post processing to account for the both the forward sweep ΔF and retrace 45 MHz−ΔF.

Exemplary signal frequencies are shown in FIG. 3, as well as subsequent drawings, to illustrate operation of the circuitry and are not intended to limit the operation frequencies that can be used with the circuitry. Further in FIG. 3 and in subsequent drawings included with the specific frequency number a signal type indicator. As shown, a 1-unit thickness indicator represents a non-modulated signal, a 2-unit thickness indicator represents a modulated signal, and a 4-unit thickness indicator indicates a signal that is both modulated and doubled in frequency. Also illustrated in FIG. 3 are the forward sweep ΔF signal lobes and the retrace signal (45−ΔF) signal lobe illustrating the difference in these signals as generated by the circuitry of FIG. 3.

Figure 4:
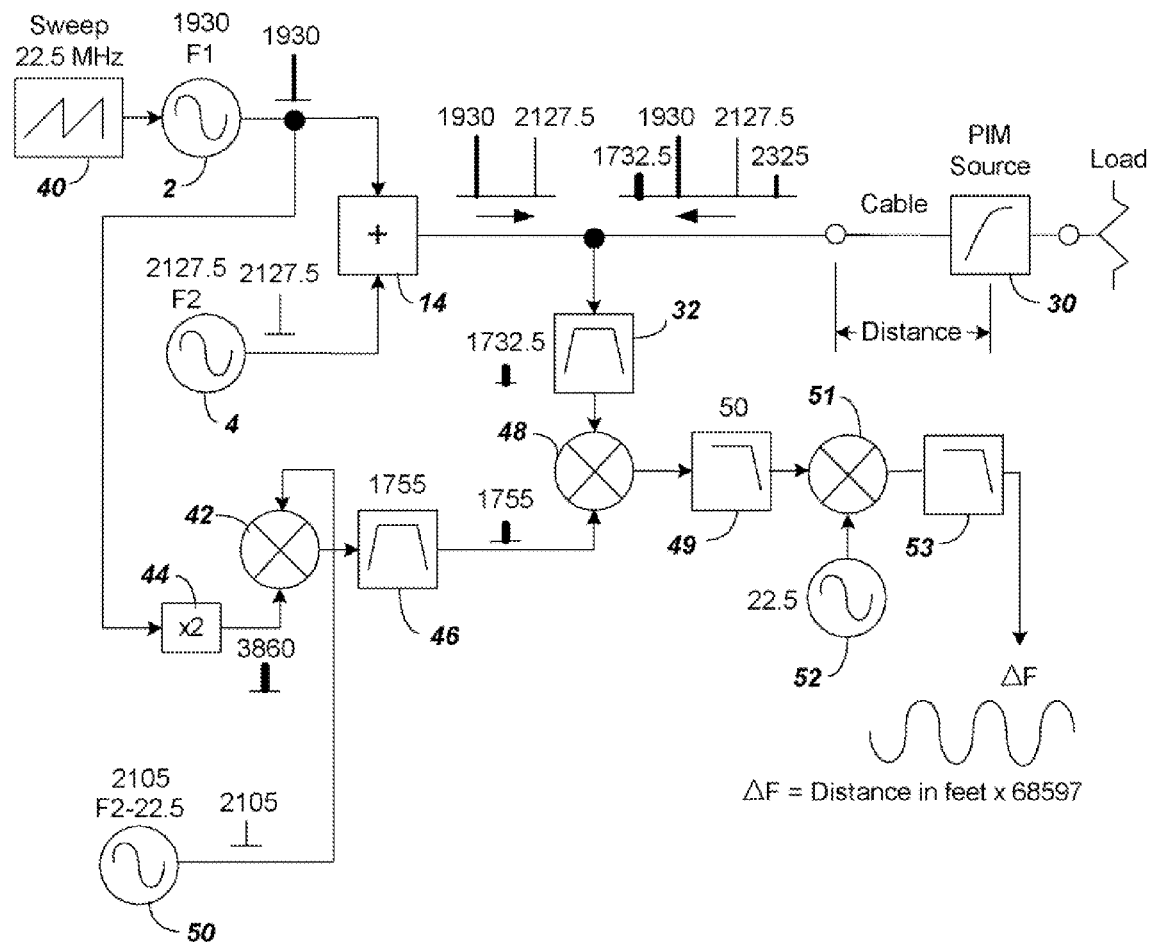
FIG. 4 shows an alternative to the circuitry to FIG. 3 for determining distance to fault using FM-CW in a PIM measurement device that will transpose the reverse sweep to the same frequency as the forward sweep.

FIG. 4 shows an alternative to the circuitry to FIG. 3 for determining distance to fault that will eliminate the retrace (45 MHz−ΔF) from the output frequency. The result will be a detected frequency of ΔF=distance×68597 for both the forward sweep and the retrace sweep. This eases the post-processing burden as well as increases the signal to noise ratio of the measurement.

The circuit of FIG. 4 includes an additional oscillator 50 operating at F2 minus the sweep frequency of sweep generator 40 (2127.5−22.5=2105 MHz in the example shown). The output of oscillator 50 is applied to the second input of mixer 42 instead of the output of the F2 oscillator 4 that is connected in FIG. 3. Thus, the output of the mixer 42 is now a signal at frequency 3860−2105=1755 MHz. The bandpass filter 46, thus, has a center frequency adjusted to 1755 MHz. The output of bandpass filter 46 at 1755 MHz mixes in mixer 48 with the output of bandpass filter 32 to provide a signal at ΔF−22.5 MHz for the forward sweep and 45 MHz−ΔF−22.5 MHz=22.5 MHz−ΔF for the retrace. These signals when mixed in mixer 51 with a fixed 22.5 MHz signal from oscillator 52 and provided through filter 53 will produce ΔF−22.5 MHz+22.5 MHz=ΔF for the forward sweep and 22.5 MHz−ΔF−22.5 MHz=−ΔF for the retrace. The distance to fault from the port P1 can, thus, be measured using the formula Distance in feet=ΔF/68597 without significant post processing.

Figure 5:
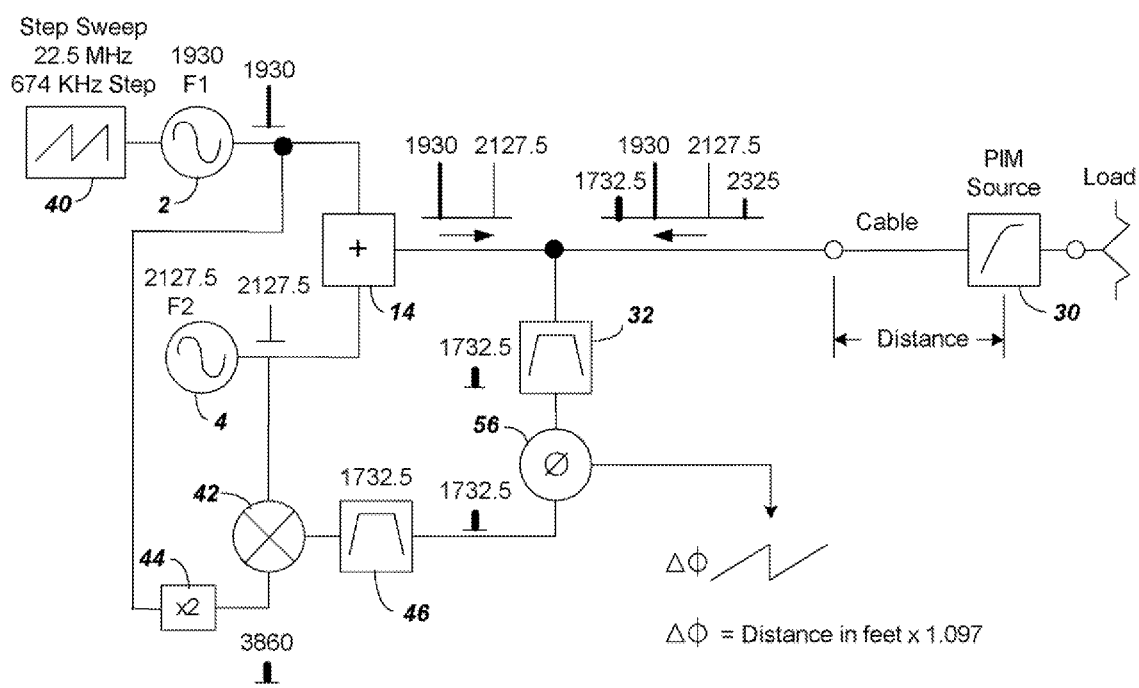
FIG. 5 shows a block diagram of a PIM measurement device using CW signals, but using phase shift, as opposed to frequency shift as in FIGS. 3-4, as a means of determining distance to fault.

FIG. 5 shows a block diagram of a PIM measurement device using CW signals, but using a change in phase, as opposed to frequency shift as in FIGS. 3-4, as a means of determining distance to fault. The sweep generator 40 uses a step frequency of 674 KHz over 33.4 steps causing a +/−11.25 MHz frequency change on F1. The reflected PIM signal will produce a phase change at phase detector 56 equal to distance in feet=Δϕ degrees/1.097 The circuit of FIG. 5 substitutes a phase detector 56 for the mixer 48 and lowpass filter 49 of FIG. 3. The inputs of the phase detector are provided from the outputs of bandpass filters 32 and 46. The filters 32 and 46 provide equal frequency outputs, both shown as 1732.5 MHz, so that the phase detector 56 then provides the phase change measurement signal Δϕ. Distance in feet from the port P1 to the PIM source can be determined in feet using the formula distance in feet=Δϕ degrees/1.097. No amplitude measurement of the PIM signal, however, will be available from the output of phase detector 56.

Figure 6:
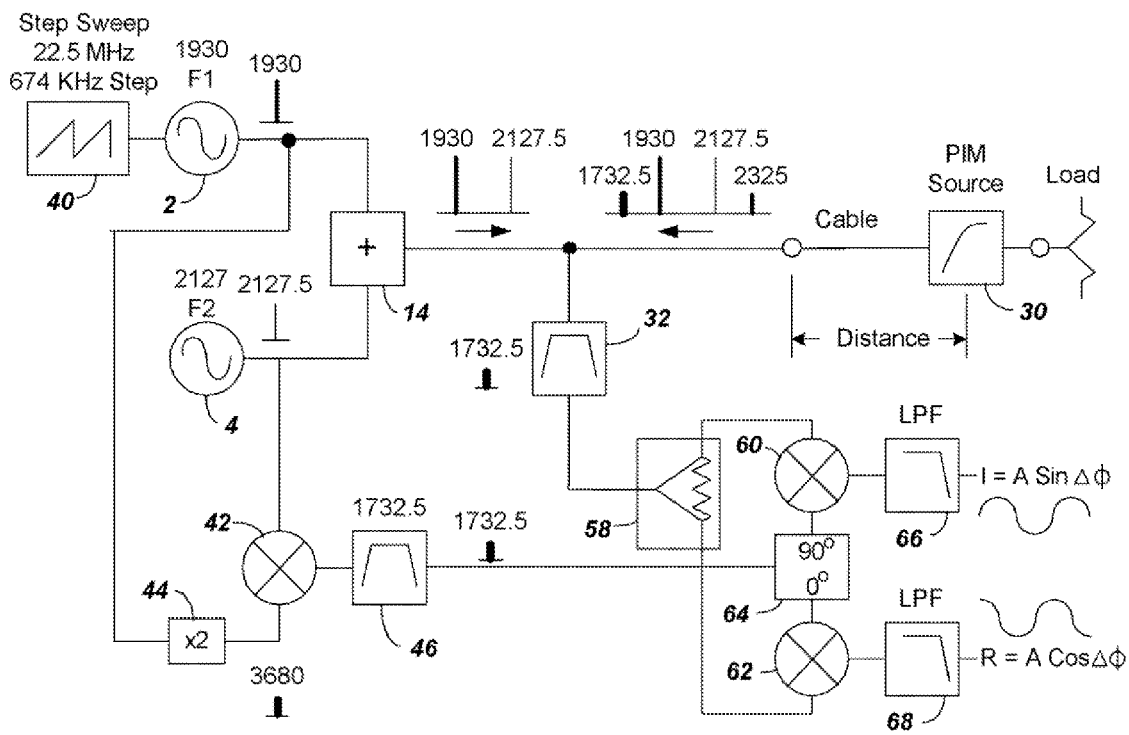
FIG. 6 shows modification to the block diagram in FIG. 5 with a linear quadrature detector circuitry added allowing both amplitude and phase measurements of the PIM signal.

FIG. 6 shows modification to the block diagram in FIG. 5 with a linear quadrature detector circuitry added allowing both amplitude and phase measurements of the PIM signal. The circuitry includes a 0/90 degree phase splitter 64 with both a 0 degree and a 90 degree phase shifted output to provide Imaginary and Real signal components to first inputs of mixers 60 and 62. The phase splitter 64 receives an input from bandpass filter 46. A 0 degree power splitter 58 receives the output from bandpass filter 32 and provides second inputs to the two mixers 60 and 62. The output of the mixer 60 is provided through low pass filter (LPF) 66 to provide an imaginary signal (I). The output of mixer 62 is provided through low pass filter (LPF) 68 to provide a real signal (R).

As indicated in the FIG. 6 the value for Δϕ=arctangent (I/R) with I being the Imaginary component from mixer 60 and R being the real component signal from mixer 68. The value of the PIM magnitude can be calculated by A=squareroot($I^2$+$R^2$).

Figure 7:
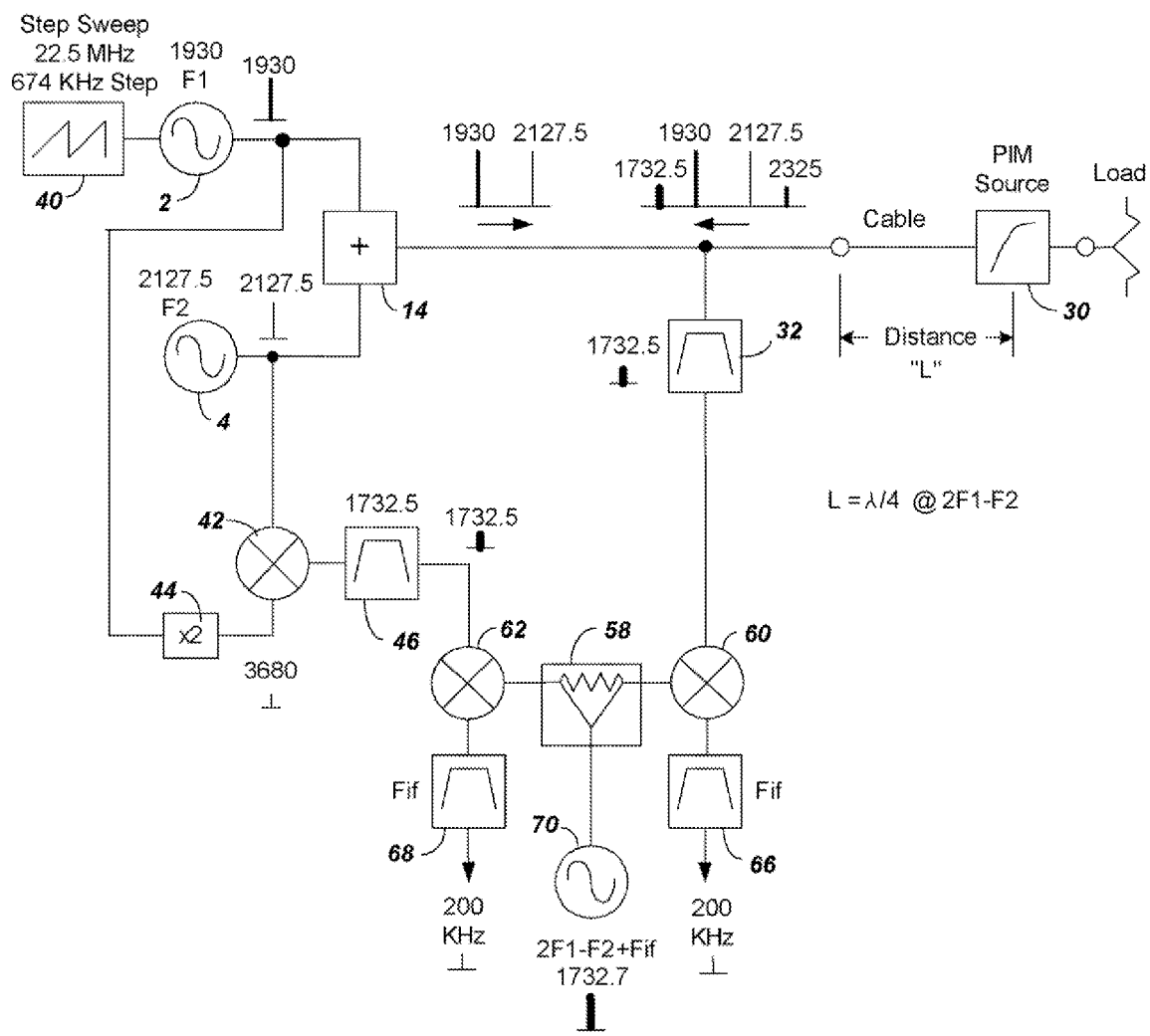
FIG. 7 shows modification to the block diagram of FIG. 5 that downconverts the varying frequency PIM signals to fixed 200 KHz offset baseband signals while still retaining the amplitude and phase of the original signals.

FIG. 7 shows modification to the block diagram of FIG. 5 that downconverts the varying frequency PIM signals to fixed 200 KHz offset baseband signals to allow measurement of distance to a PIM source as well as magnitude of the PIM source using low frequency A/D conversion. In FIG. 7 an oscillator 70 is added operating at the frequency 2(F1+FM)−F2 plus the desired fixed offset intermediate frequency (Fif) to serve as a local oscillator for downconversion to baseband. Here with the desired offset of Fif being 200 KHz, F1 being 1930 MHz and F2 being 2127.5 MHz, the frequency of oscillator 70 is shown at 1732.7 MHz. A connection from step sweep generator 40 is made to oscillator 70 to provide the sweep offset FM. Also added in place of the phase detector 56 of FIG. 5 are 0 degree splitter 58 mixers 60 and 62 and output bandpass filters 66 and 68.

In the circuitry of FIG. 7, the mixer 60 has an input receiving the reflected signal from the PIM source through bandpass filter 32. The mixer 62 has an input receiving a reference signal from the output of bandpass filter 46. A second input of the mixers 60 and 62 receive the output of local oscillator 70 as provided through splitter 58. The output of filter 68, thus, provides a reference signal downconverted to 200 KHz, while the output of the filter 66 provides the reflected signal for measurement downconverted to 200 KHz. The fixed 200 KHz signals from filters 66 and 68 can be processed to measure PIM amplitude as well as distance to fault using phase angle.

Figure 8:
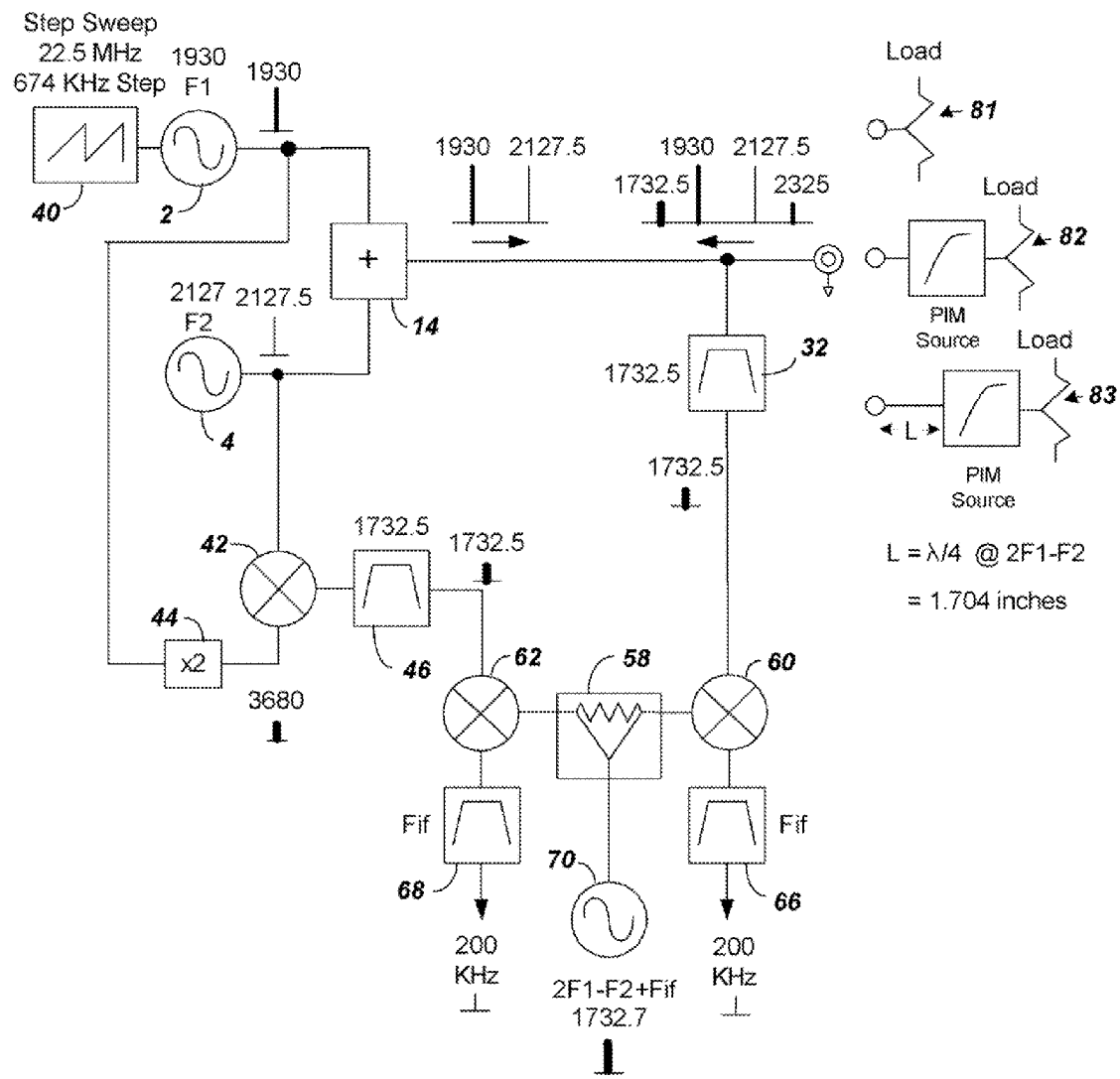
FIG. 8 shows the PIM measurement circuit of FIG. 7 with calibration components added to enable calibrating the distance and amplitude of the reflected PIM measurement.

FIG. 8 shows the PIM measurement circuit of FIG. 7 with calibration components added to enable calibrating the distance, phase and amplitude for a one port PIM reflection measurement. A non PIM producing load 81 provides a first calibration component used to provide a phase and amplitude reference to measure the system's inherent PIM for cancellation. A known PIM standard with a series load 82 is connected and measured relative to the standard load 81 as a second calibration component. Finally, a PIM source with a ¼ wavelength section of line length (L) at the frequency of 2F1-F2 is attached as a third standard 83, enabling the different length line to produce a 180 degree phase shift on the returned PIM measurement for comparison. The resulting calibration will yield a full scale measurement of the known PIM standards down to the system noise floor.

Figure 9:
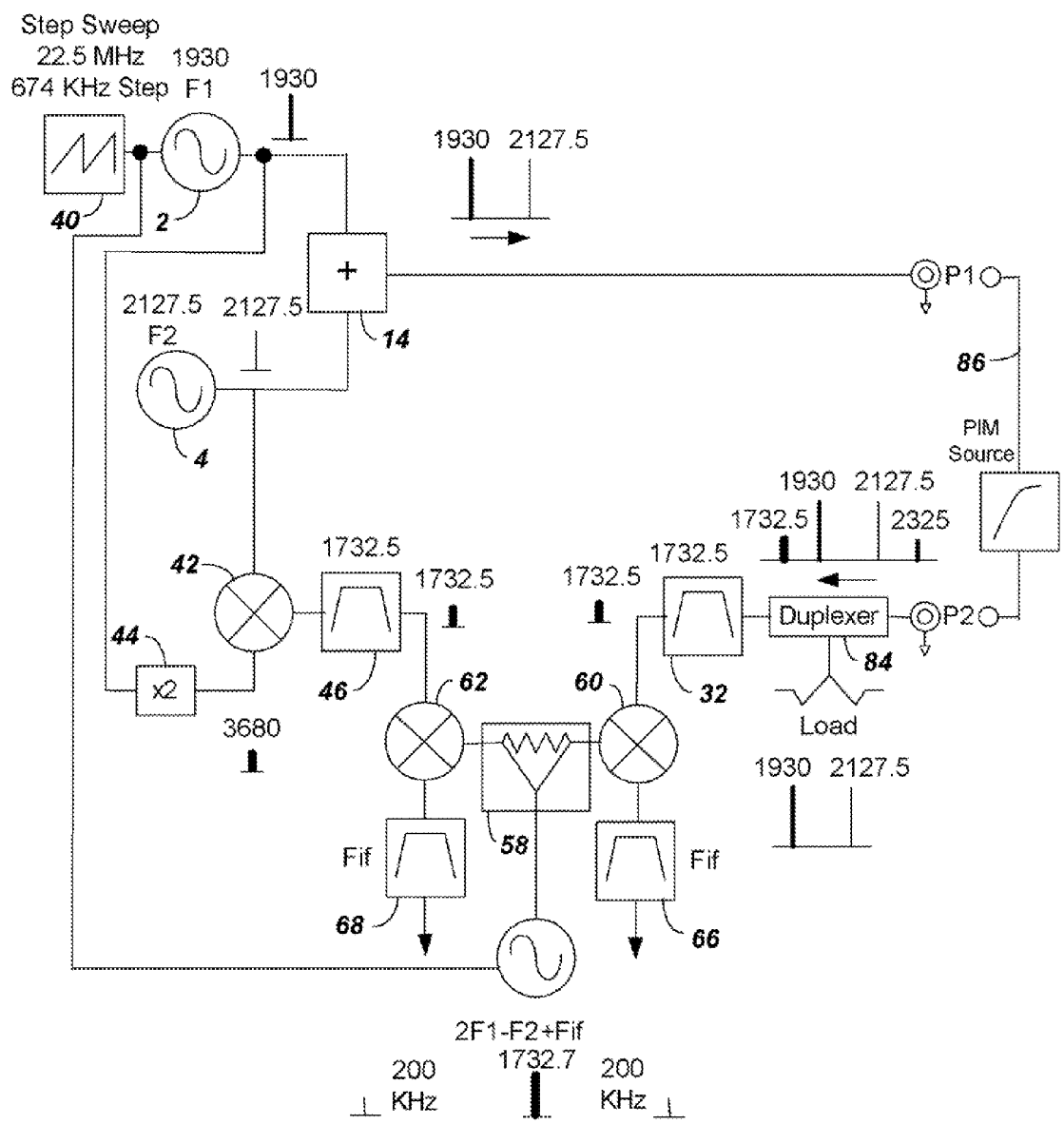
FIG. 9 is a block diagram showing modification of the circuit of FIG. 7 to make a through PIM measurement.

FIG. 9 is a block diagram showing modification of the circuit of FIG. 7 to make a through PIM measurement. The circuit includes both a port P1 and port P2. The return path through bandpass filter 32 is disconnected from its connection to port P1 in FIG. 8, and connected through a duplexer 84 to port P2 in FIG. 9. An unknown PIM source with cable 86 is connected between ports P1 and P2 for the through measurement. As illustrated, the two signals F1=1930 MHz and F2=2127.5 MHz are provided to port P1, while those signals along with signals of 2F1-F2=1732 MHz and 2F1+F2=2325 MHz generated by the PIM source proceeds through port P2 and duplexer 84. The duplexer 84 sends the signals at 1930 MHz and 2127.5 MHz to a load, while the remaining signals are provided through bandpass filter 32 centered at 1732.5 MHz. Thus, the 1732.5 MHz forward unknown PIM signal is provided to mixer 62, while the 1732.5 frequency reference signal is provided through mixer 60 for downconversion and subsequent measurement.

Figure 10:
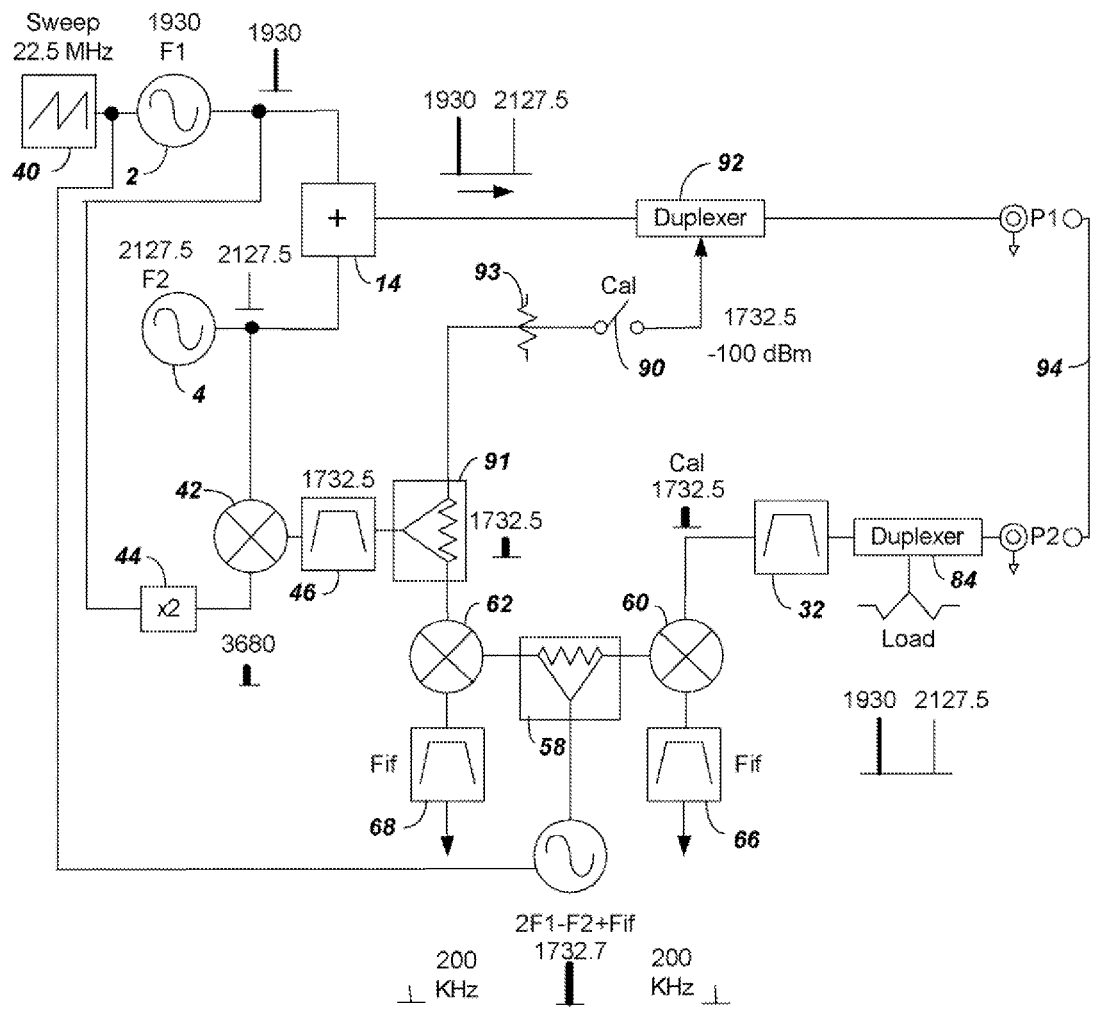
FIG. 10 shows modification to the measurement circuit of FIG. 9 that allows for a through calibration to enable characterization of the signal output of mixer 42.

FIG. 10 shows modification to the measurement circuit of FIG. 9 that allows for a through calibration of a known PIM signal. The circuit of FIG. 10 modifies the circuitry of FIG. 9 to include an internal calibration switch 90, a 0 degree splitter 91 a precision attenuator 93 and duplexer 92. The calibration switch 90 allows connection of the precision calibrated 1732.5 MHz output of filter 46 to duplexer 92 when calibration is desired. The 0 degree splitter 91 enables the signal from filter 46 to be provided to the calibration switch 90 as well as to the mixer 62 for downconversion to provide a reference signal. The duplexer 92 connects to the calibration switch 90 and allows forward transmission of the reference PIM signal level through switch 90 to port P1, as well as the signal from combiner 14 to pass to test port P1. The duplexer 92 prevents any signals other than the 2*(F1+FM)−F reference signal and F1+FM and F2 from leaving port P1 while preventing F1+FM and F2 from entering the switch 90. The thru line 94 is used during calibration along with calibration switch 90 so that the calibration signal from attenuator 93 is provided through test ports P1 and P2 and is then downconverted to a thru signal using mixer 60. The thru signal is compared with the reference signal output from mixer 62 to enable the thru calibration.

Figure 11:
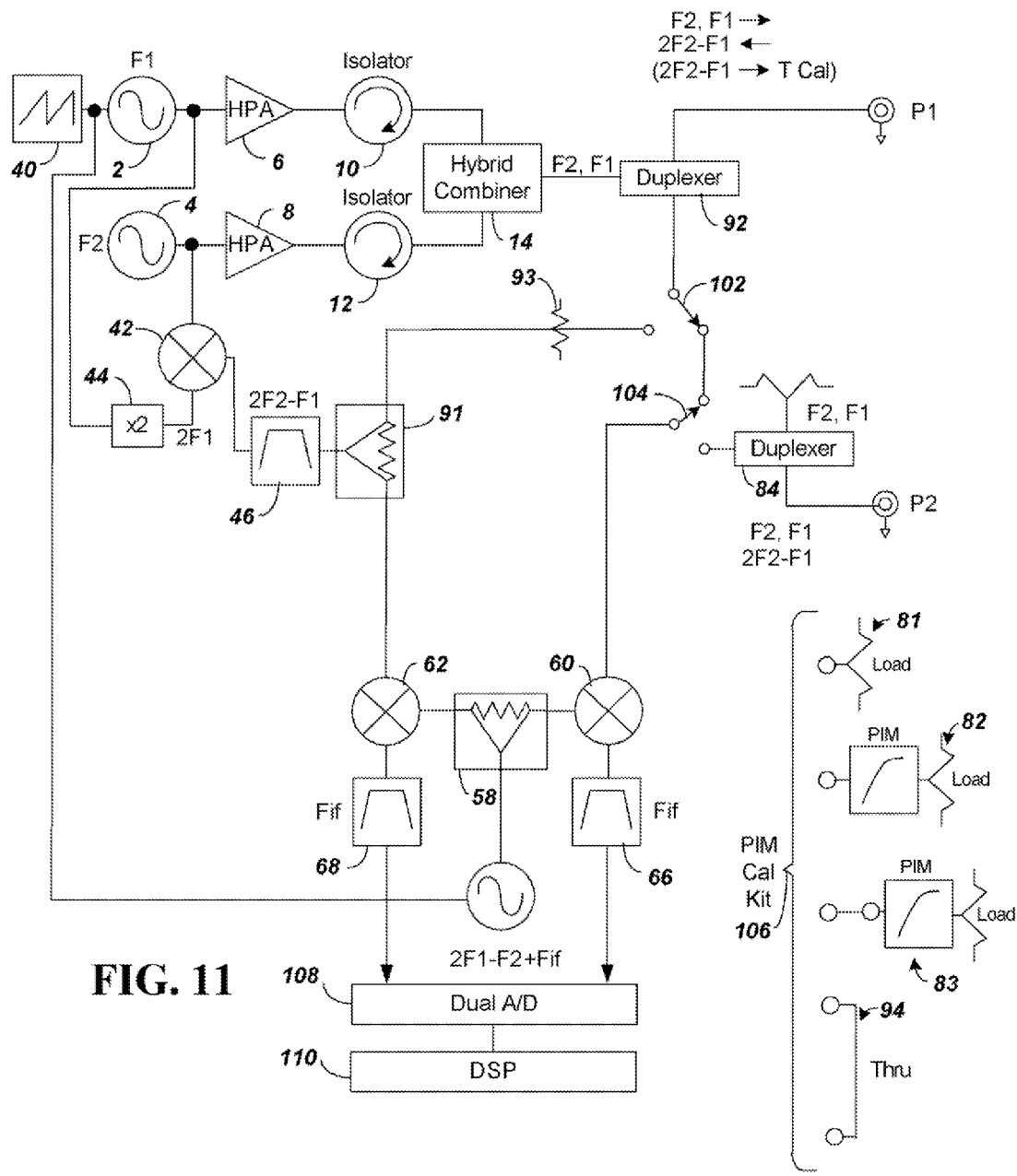
FIG. 11 shows a full implementation of a distance to fault analyzer as shown in FIG. 7 through FIG. 10.

FIG. 11 shows a full implementation of a distance to fault analyzer as shown in FIG. 7 through FIG. 10. The circuit of FIG. 11 modifies the circuitry of FIG. 10 to substitute calibration switch 90 with switches 102 and 104. Switch 102 provides the same function of switch 90 to connect or disconnect the output of 0 degree splitter 91 and attenuator 93 to duplexer 92 during through calibration. Switch 102 in combination with switch 104 further allows the test port P1 to be connected to the mixer 60 to provide a downconverted reflected signal for comparison to the reference signal measurement from mixer 62. The switch 104 alternatively allows the test port P2 to be connected to mixer 60 to provide a downconverted through (T) measurement, or to allow the switch 102 to connect test port P1 to mixer 60. The calibration components as well as PIM measurement devices are combined as a PIM calibration kit 106 and can be connected for test measurements as described with respect to FIGS. 8 through 10.

FIG. 11 further shows that the frequency domain can be converted to time or distance calculation using a DSP 110. The DSP 110 can be simply programmed to perform the distance calculation from measurements taken using the test setup of FIG. 11. The DSP 110 for determining distance can be a single device that also does processing of the, reflected and through signals for a test measurement. Although shown as a DSP 110, it is understood that a microprocessor, field programmable gate array (FPGA), or a general application specific integrated circuit (ASIC) can be used to provide frequency to time domain conversion to determine distance to a PIM either together or separate from other measurement circuitry. The DSP 110 is provided in combination with a dual A/D converter 108. The dual converter 108 converts the analog forward signal from one analog port to digital, and converts the analog reverse signal or through signal at the other port to a digital signal for processing in the DSP 110. Although shown with a dual A/D converter 108, separate simultaneously triggered converters can be used. As indicated previously, the system of FIG. 11 provides PIM measurements and differs from a standard VNA by separating forward and reverse signals using duplexer 92 rather than a directional coupler.

In one illustrative example, a PCS device is used along with an AWS device to illustrate how frequencies can create passive intermodulation (PIM). In the example, the PCS transmit operation frequency is 1930 MHz and the AWS transmit frequency is 2127.5 MHz. The AWS receive channel operates in the range of 1710 MHz to 1755 MHz. A ΔF of +/−11.25 MHz centered at the PCS frequency of 1930 will produce an intermodulation frequency at 2*1930-2127.5 or 1732.5 MHz with a ΔF of +/−22.5 MHz due to the 2×multiplier in the intermodulation equation, or 1732.5+/−22.5 MHz. This will interfere with the AWS receive channel range of 1710-1755 MHz, and the distance to PIM measurement will indicate the amplitude of the interference as well as the distance to any defective component causing the PIM.

The minimum distance that can be measured to a fault in a distance to PIM distance to fault analyzer can be easily calculated using the formula below. The minimum distance is related to the velocity of propagation for the cable. For a typical low loss cable having a propagation of 0.9 and using a sweep frequency Fswp of 45 MHz, due to the 2F1 doubling of sweep frequency, can be calculated as follows:

$$dist_{min} = \frac{C * Vp}{2 * Fswp} = \frac{186,000 \text{ mi/S} * 5280 \text{ Ft/mi} * 0.9}{2 * 45 * 10^6} = 9.82 \text{ Ft}$$

Figure 12:
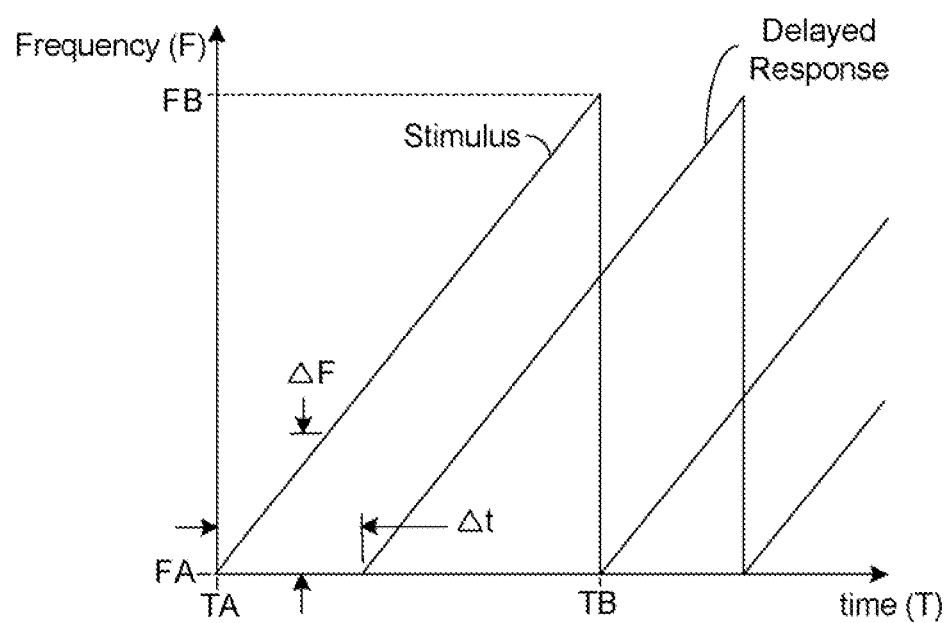
FIG. 12 provides a graph of a stimulus signal and a delayed response signal caused by a PIM reflection to illustrate variables used to calculate a difference frequency, $\Delta F$.

Determination of distance from frequency caused by delay ΔF can similarly be easily calculated as described below with reference to FIG. 12. FIG. 12 provides a graph of a stimulus signal and a delayed response signal caused by a PIM reflection. The graph of FIG. 12 plots change of frequency versus change in time. The difference frequency caused by delay ΔF shows the frequency change from the stimulus to the delayed response signal. Similarly, the change of time Δt shows a time delay between the stimulus and the response. An initial time TA and initial frequency FA are shown for the plots. Further a frequency FB is shown illustrating the maximum frequency difference between the minimum frequency FA and maximum frequency of both the stimulus and delayed response signal.

With reference to FIG. 12, the formula for difference frequency ΔF is as follows:

$$\Delta F = \Delta t \frac{FB - FA}{TB - TA} = \Delta t \frac{Fswp}{tswp}$$

The formula for Δt can further be calculated as follows:

$$\Delta t = \frac{2 * dist}{C * Vp}$$

Substituting the formula for Δt, the formula for ΔF becomes:

$$\Delta F = \frac{2 * dist * Fswp}{C * Vp * tswp}$$

For an FM CW linear saw tooth ramp, and assuming a non-aliased two way cable to PIM distance of 100 m or 328 Ft and Vp of 0.9, sweep time, tswp, is as follows:

$$tswp = \frac{4 * dist}{C * Vp} = \frac{4 * 328 \text{ ft}}{186,000 \text{ mi/S} * 5280 \text{ Ft/mi} * 0.9} = 1.4844 \text{ uS}$$

Providing this value for tswp into the formula for ΔF and using the sweep frequency Fswp of 45 MHz and Vp of 0.9, we obtain ΔF as follows:

$$\Delta F = dist \text{ in feet} * \frac{2 * 45 * 10^6}{186,000 \text{ mi/S} * 5280 \text{ Ft/mi} * 0.9 * 1.488 * 10^{-6}} =$$

dist in feet * 0.68597

II. Variable Harmonic Distance To Fault Analyzer

Figure 13:
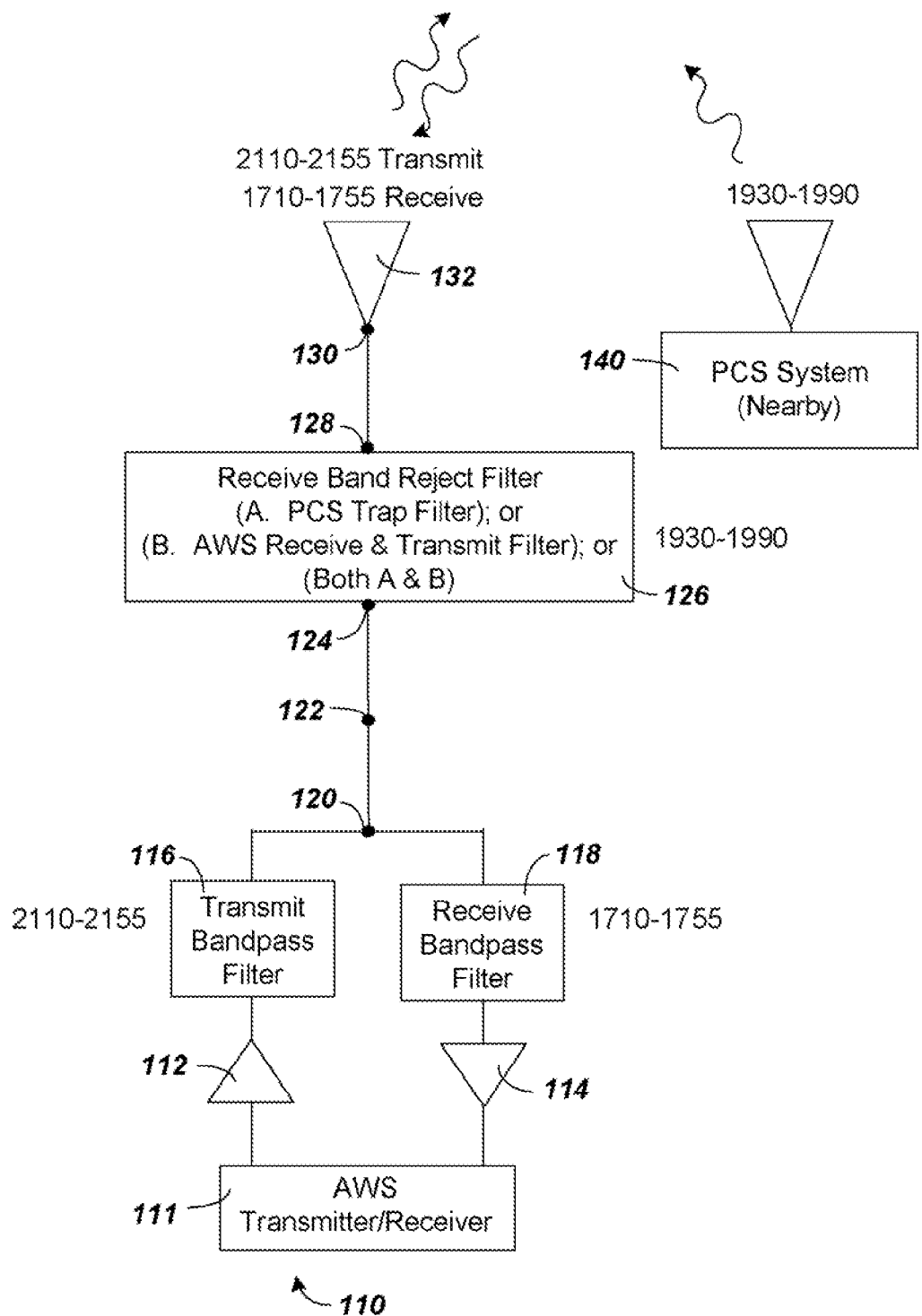
FIG. 13 shows components of an AWS system placed in close proximity with a PCS system to illustrate how testing may be required with a higher harmonic than a third order harmonic.

FIG. 13 shows components of an Advanced Wireless Service (AWS) Band AWS system placed in close proximity with a Personal Communication System (PCS) system to illustrate how testing may be required with a higher harmonic than a third order harmonic that is provided in the systems of FIGS. 3-11. The system of FIG. 13 includes an AWS transmitter/receiver base station 111. Transmit signals are provided through amplifier 112 and filter 116. The filter 116 allows passage of signals within the AWS transmit band of 2110-2155 MHz. The transmit signal is then provided through filter 126 and antenna 132 for transmission. Signals received by antenna 132 are provided back through filter 126 to bandpass filter 118 that allows signals within the receive band of 1710-1755 MHz to pass to the AWS base station 111. The receive signals then travel through amplifier 114 to the receive unit of the base station 111. A PCS base station 140 that transmits in the frequency range of 1910-1930 MHz is shown operating nearby. Hence, the filter 126 is included to block signals in the PCS range of 1910-1930. As described to follow, the test system configuration of FIGS. 3-11 will not easily operate to test the system shown in FIG. 13 which includes the filter 126 blocking signals in the PCS range.

In the test systems of FIGS. 3-11, all generate a F1 signal at 1930 MHz which will be blocked by the filter 126. Other signals generated in the systems of FIGS. 3-11 are not in the PCS range. The x2 multiplier 44 is shown providing a 3860 MHz signal to mixer 42, while the other input of mixer 42 receives a 2127.5 MHz signal to create an output at 1732.5 MHz that is the third harmonic of the output of signal combiner 18. The filter 46 has a bandpass region set to select this third harmonic of 1732.5 MHz. Filter 32, providing a PIM signal for analysis, is then also set with a bandpass region at this third harmonic of 1732.5 MHz that can be downconverted using the output of filter 46.

Other transmit signals than the 1930 MHz F1 might be used to get outside the 1930-1990 MHz PCS frequency since the AWS receive band of 1710-1735 MHz and the transmit band of 2210-2155 MHz are both outside the PCS range. However, PIMs can occur at connection points 120, 122, 124, 128 and 130 within the AWS system that can convert an AWS signal into the 1930-1990 PCS frequency signal range. The filter 126 is, thus, primarily included to prevent signals in the PCS range of 1930-1990 MHz due to PIMs. The filter 126 is termed one of the following: (A) a PCS band reject filter, or PCS trap filter; (B) an AWS transmit and receive region bandpass filter, or (C) both A and B.

It would be desirable to produce two signals within the AWS band of 2110-2155 MHz that will produce a PIM within the 1710-1755 MHz AWS receiver band. But this cannot be done until a receive downconversion signal is provided at approximately the $19^{th}$ order. The x2 multiplier 44 in each of FIGS. 3-11 allows only the $3^{rd}$ order to be produced to downconvert the test signal to detect a PIM.

Figure 14:
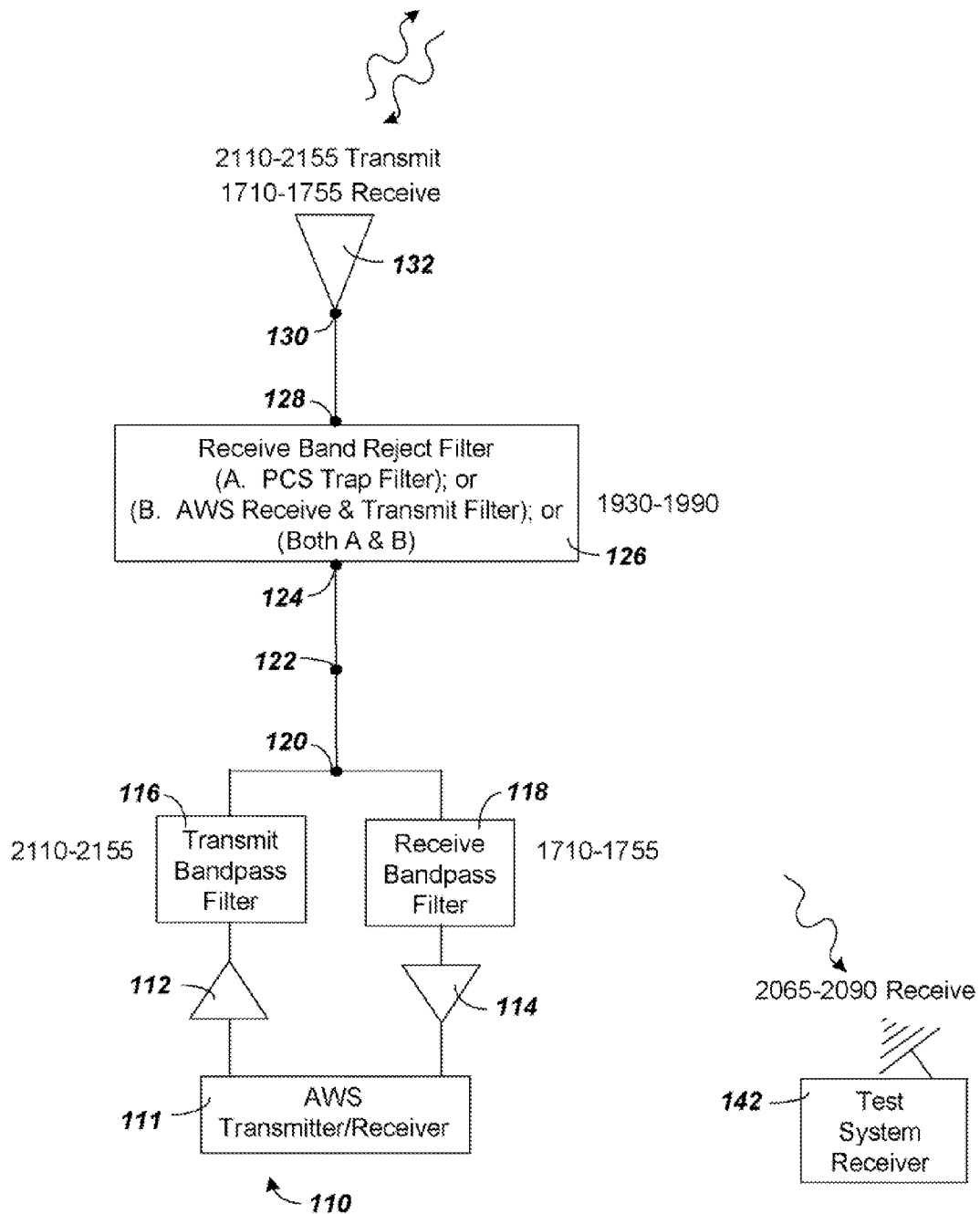
FIG. 14 shows an external test system receiver that allows testing for PIMs with using a third order harmonic of two signals generated from an AWS transmitter.

FIG. 14 illustrates one solution to allow PIMs to still be detected using a third order harmonic of two signals generated from an AWS transmitter. The solution is to provide a test system receiver 142 outside the tower separate from the 1710-1755 AWS receiver 111. The external receiver 142 with an antenna is not restricted to a specific frequency range. Thus, two signals can be transmitted from the AWS transmitter 111 in the 2110-2155 MHz band to enable testing for PIMs that do not create a third order receive signal within the range of the 1930-1990 MHz trap 126, even though the third order receive signal is outside the 1710-1755 MHz range of the AWS receiver 111. For instance, the two transmit signals in the range of AWS transmitter 111 could be 2110 MHz and 2155 MHz. Then the external receiver 142 would receive the third harmonic at 2×2110−2155=2065 MHz. The 2065 MHz signal will not be in the range of the 1930-1990 MHz trap 126. The frequency range of test system receiver 142 thus has 2065 MHz at the low end of its range. Assuming continued use of the 2110 MHz AWS transmit signal as the lower of the two frequencies, other higher frequencies possibly ranging down to 2130 MHz might provide the second signal. Using 2110 MHz and 2130 MHz as the two AWS transmit signals, the external receiver 142 would then receive the third harmonic at 2×2110−2130=2090 MHz. Thus, the test system receiver 142 is shown in FIG. 14 with a full operation range of 2065-2090 MHz. Components of the AWS system that are carried forward from FIG. 13 are similarly labeled in FIG. 14, as will be components carried over in subsequent drawings. Since providing a test system that requires a stand alone transmitter or receiver system may be undesirable, it is important also to provide a system that relies only on components of the transmit/receive system being tested.

Figure 15:
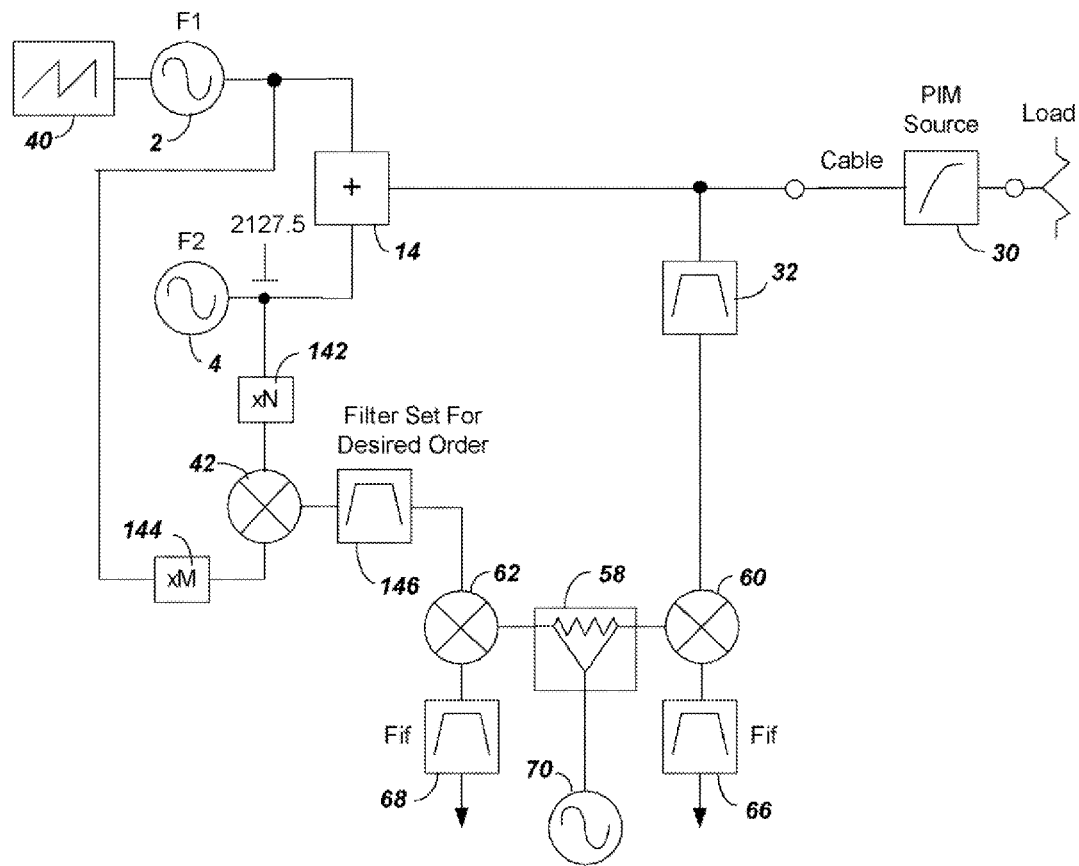
FIG. 15 shows how replacing the x2 multiplier of the test system of FIGS. 3-10 with a variable number xM multiplier and a xN multiplier allows selection of a desired harmonic above a third order using the AWS transmitter and receiver.

A solution according to another embodiment of the present invention that allows use of the AWS transmitter and receiver bands for testing without requiring a separate stand lone receiver is shown in FIG. 15. The system includes components that replace the x2 multiplier 44 of FIGS. 3-10 with a variable number times M (xM) multiplier 144 and uses another times N (xN) multiplier 142 to allow selection of a desired harmonic. The xM multiplier 144 is provided in place of the x2 multiplier 44 to connect the F1 signal, while the xN multiplier 142 is introduced to connect the F2 signal to mixer 42. With the system of FIG. 15, the $19^{th}$ harmonic can then be provided with appropriate selection of the values of M and N to allow use of the AWS transmitter range of 2110-2155 MHz to generate two test signals and the AWS receiver bandwidth range of 1710-1755 MHz to detect the PIM signals. The filter 46 of FIGS. 3-10 is replaced by a filter 146 tuned to a desired harmonic, rather than strictly the $3^{rd}$ order harmonic, to select the desired harmonic signal from mixer 42.

Figure 16:
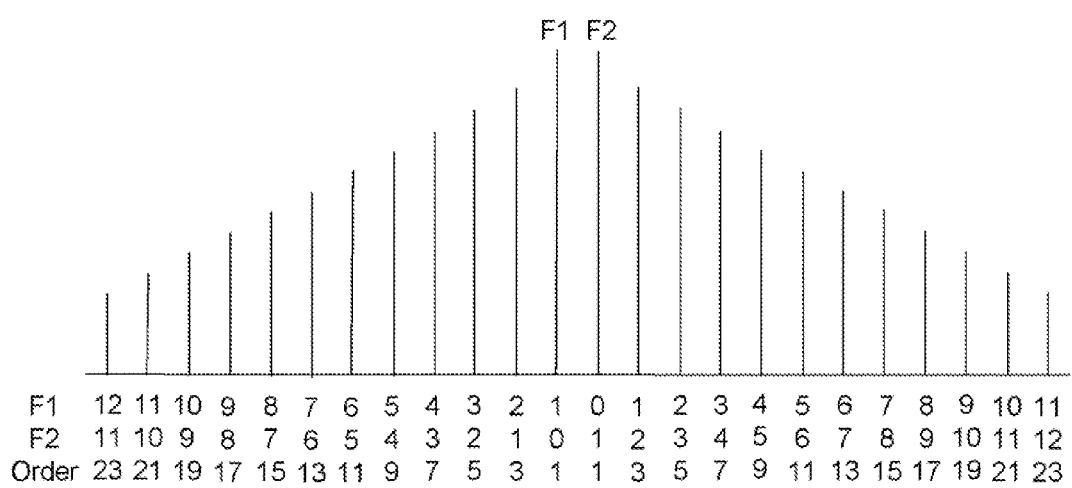
FIG. 16 is a graph illustrating the possible multiples of F1 and F2 needed for the multiplier values M and N in FIG. 15 to give a desired harmonic order.

FIG. 16 illustrates possible choices of multiples of signals F1 and F2 that can be generated by selecting an appropriate value of M for multiplier 144 and N for multiplier 142 and the resulting combined signal order. As seen from the chart of FIG. 16, to generate the $19^{th}$ order, either a $9^{th}$ order signal from F1 is mixed with a $10^{th}$ order signal from F2, or a $9^{th}$ order signal from F2 is mixed with a $10^{th}$ order signal from F1. The descending amplitude as the order increases in FIG. 16 illustrates how power decreases with the increasing harmonic order.

In one example where the $19^{th}$ order is used, the signal F1 is chosen as 2154 MHz and signal F2 is chosen as 2110 MHz, both within the AWS transmit band. The multiple of signal F1 is set at 9×2154 MHz, so the multiplier 144 has M set at 9. The multiple of signal F2 is set at 10×2110 MHz, so the multiplier 142 has N set at 10. This generates an output of 10×2110−9×2154=1714 MHz. Filter 146 then is set to 1714 MHz, which is within the bandwidth of the AWS receiver 111 shown in FIG. 13. And no signal is within the PCS range of 1930-1990 MHz of the trap band reject filter 126.

In another example, the $19^{th}$ order is used again with F1 set at 2150 MHz and F2 set at 2119 MHz, both within the AWS transmit band. The multiple of F1 is set at 9×2150 GHz, so the multiplier 144 has M set to 9. The second signal F2 is set at a frequency of 10×2110 GHz, so the multiplier 142 has N set to 10. This generates an output of 10×2110−9×2150=1750 MHz, which is at the other end of the AWS receive bandwidth than the previous example but still within the AWS receive band. Filter 146 then is set to 1750 MHz, and no signal is within the PCS range of 1930-1990 MHz of the trap band reject filter 126.

The full $19^{th}$ order signals can be generated to be received within the full 1710-1755 MHz AWS receive band as illustrated by the two previous examples. Other bands above the $3^{rd}$ order will also provide signals within the 1710-1755 MHz AWS receive band, but not necessarily throughout the AWS receive band. For instance, a portion of the $17^{th}$ order signal can be received within the 1710-1755 MHz band.

Appendix A provides a BASIC program that can be used to determine orders of signals that will be within the receive bandwidth from signals that can be provided from a transmit bandwidth of a transmitter/receiver device, such as an AWS base station. The initial inputs to the program are the transmitter lower and upper frequency limits, Fxmt low and Fxmt high, and the receiver lower and upper frequency limits, Frcv low and Frcv high. The program then steps through the transmit frequencies and harmonic orders and prints out the order and receive frequency when the order allows generation of a receive bandwidth within the receive bandwidth range input to the program. The user can then select a desired pair of signals and an harmonic order from those listed.

Figure 17:
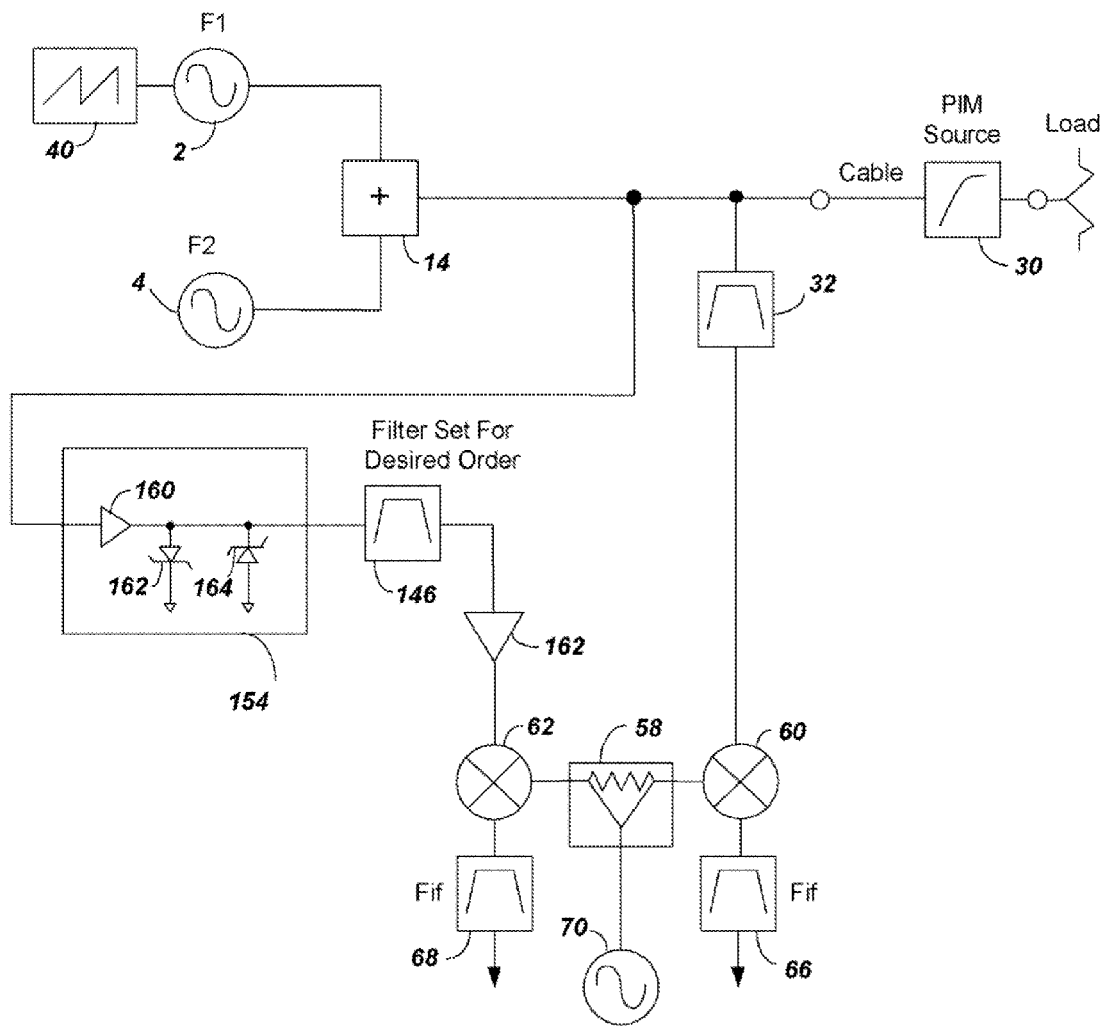
FIG. 17 shows an alternative configuration to FIG. 15 that includes an amplifier and clipping diodes to allow operation at any desired harmonic.

FIG. 17 shows an alternative configuration to FIG. 15 that will allow signals to be generated within the 2110-2155 MHz AWS transmit band, and allow reception of any desired harmonics, including those above the $3^{rd}$ harmonic to provide receive signals that lie within the 1710-1755 MHz AWS receive band. The circuit of FIG. 17 removes the multipliers 142 and 144 of FIG. 15 and their connection to the F1 and F2 signal generators, and replaces them with the circuitry 154 connected to the output of the combined F1 and F2 combiner 14. The circuitry 154 is designed to generate all harmonic orders. The filter 146 is then used to select the desired harmonic for use in downconversion. Because of the signal reduction due to clipping diodes 162 and 164, an amplifier 162 is provided at the output of filter 146.

The circuit 154 in the embodiment shown in FIG. 17 includes an amplifier 160 and clipping diodes 162 and 164. The clipping diodes create all harmonics. Because harmonics on the order of the $17^{th}$ or $19^{th}$ will have a very low power level, amplifier 160 is used to assure sufficient power is provided to enable use of these higher harmonics. The clipping diodes 162 and 164 are connected in an opposing fashion between the output of amplifier 13 and ground.

Figure 18:
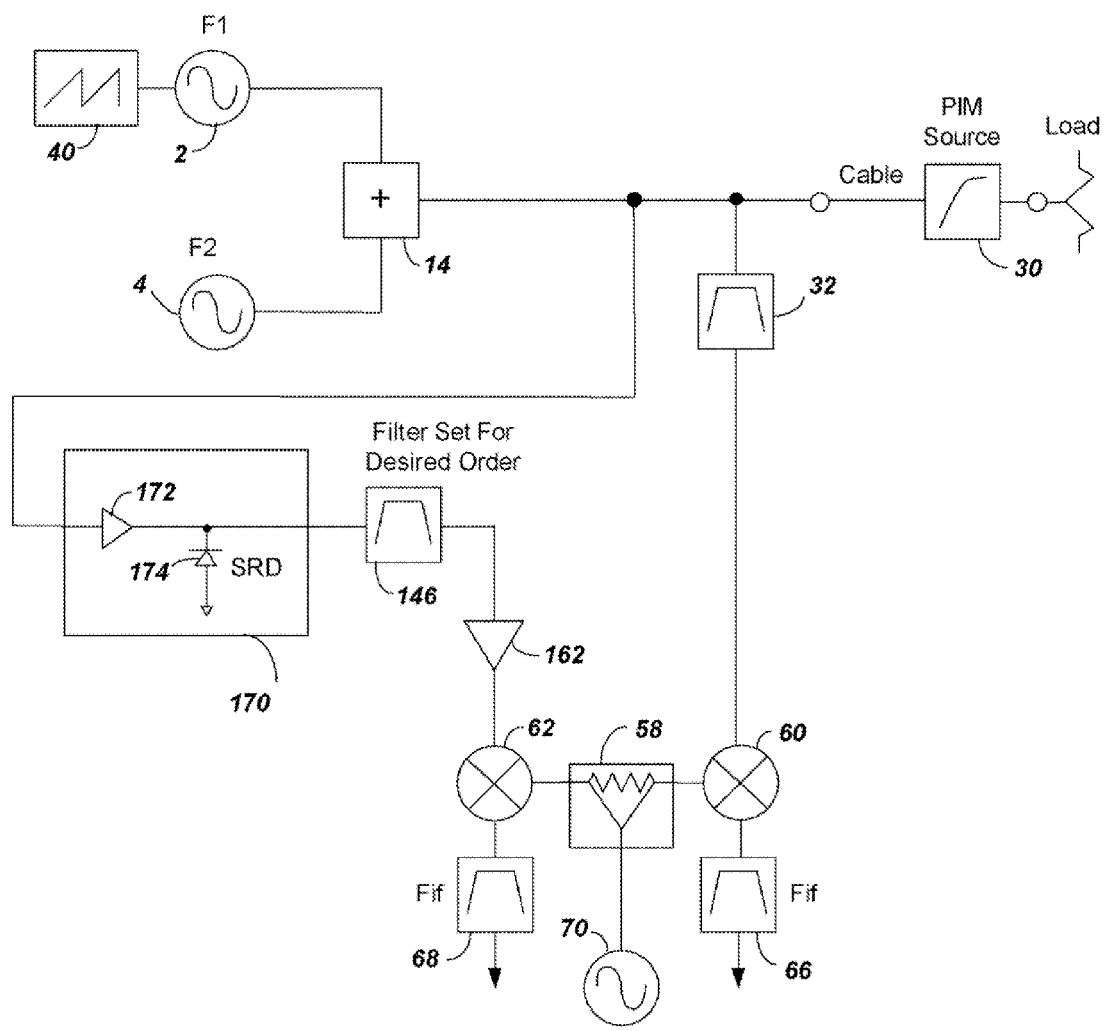
FIG. 18 shows an alternative to the configuration of FIG. 17 that replaces the clipping diodes with a step recovery diode (SRD)

FIG. 18 shows an alternative to the configuration of FIG. 17 that replaces the clipping diodes circuitry 154 with a Step Recovery Diode (SRD) circuit 170. The SRD 174 included in circuit 170 like the clipping diodes 162 and 164 will generate all harmonics. To enable low signal strength high order signals to be used the SRD 174 will be placed in series with amplifier 172 in the circuit 170. The filter 146 would continue to be set to pass the desired order. Because of the signal reduction due to Step Recovery Diode 174 an amplifier 162 is provided at the output of filter 146.

Although the downconversion circuitry shown in FIGS. 15, 17 and 18 uses mixers as shown in FIG. 7, in alternative embodiments, the components of FIG. 15, 17 or 18 could be used in other circuit arrangements of FIGS. 3-11. For example, the outputs of the filters 146 and 32 of FIGS. 15, 17 and 18 can be provided to a phase detector 66 as in FIG. 5, rather than to mixers 60 and 62. Similarly, the output of filter 32 in FIGS. 15, 17 and 18 can be provided through a splitter, while the output of filter 146 is provided to a phase shifter to enable creation of quadrature signals as in FIG. 6. Finally, although shown as receiving a reflected signal for testing through filter 32, the signal received could be a through signal in FIGS. 15, 17 and 18, as in FIG. 9, or a selectable reflected or through signal as in FIGS. 10-11.

Figure 19:
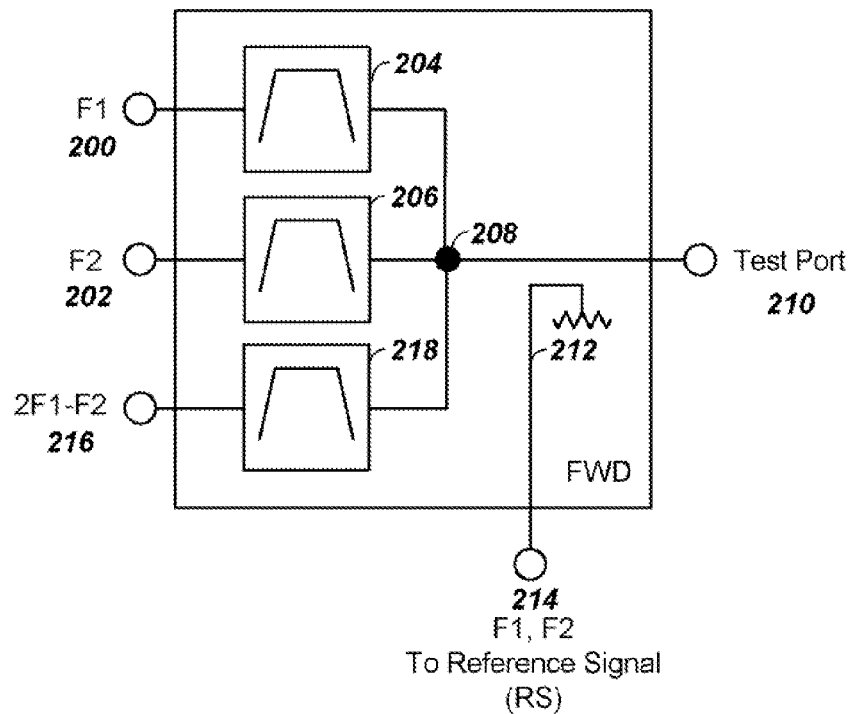
FIG. 19 shows a triplexer with a high isolation forward coupler used to develop a reference signal, in accordance with an embodiment.

FIG. 19 shows a triplexer with a high isolation forward coupler used to develop a reference signal, in accordance with an embodiment. A signal combiner and coupler can be integrated into a five-port module, such as the triplexer shown in FIG. 19. As shown in FIG. 19, the five port module includes a first port 200 and a second port 202 which receive input signals F1 and F2, respectively. Each input is passed through a band pass filter, 204 and 206, before being combined at 208. The combined signal is then output to a third port (test port 210) via high isolation forward coupler 212, which transmits the combined signal to the test port while simultaneously extracting a portion of the combined signal. The portion of the combined signal is transmitted to fourth port 214 where it can be used to develop a reference signal (RS), for use as described above. The five port module shown in FIG. 19 can further include a fifth port 216 which receives a portion of a reflected intermodulation signal (RIS). Band pass filter 218 can be selectively configured to pass the particular portion of the RIS to port 216. For example, as shown in FIG. 19, a center frequency of 2F1-F2 can be chosen for the band pass filter, enabling signals with a frequency of 2F1-F2 to pass to port 216.

Figure 20:
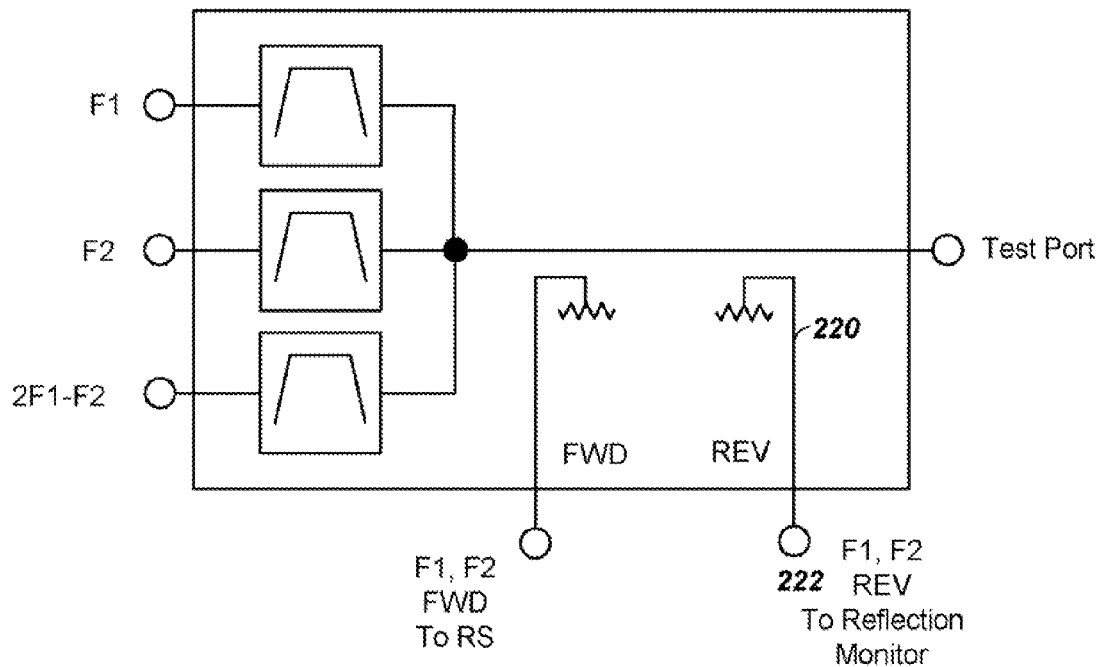
FIG. 20 shows a triplexer with a high isolation forward coupler and a high isolation reverse coupler, in accordance with an embodiment.

FIG. 20 shows a triplexer with a high isolation forward coupler and a high isolation reverse coupler, in accordance with an embodiment. The triplexer shown in FIG. 20 is a six-port module, similar to that shown in FIG. 19 with the addition of a high isolation reverse coupler 220. The high isolation reverse coupler is connected between the output of the high isolation forward coupler and the test port. The high isolation reverse coupler transmits the combined signal from the high isolation forward coupler to the test port while also extracting a portion of any RIS reflected from the test port. The portion of the RIS is transmitted to sixth port 222, where it can be used to develop a monitor signal. The monitor signal can be used to protect the F1 and F2 signal sources in the event of a high reflection signal from the test port, by reducing or shutting down the F1 and F2 signal sources. The protective action, if any, taken by the monitor will depend on the power level of the reflection signal. For example, if the reflection signal has a power level below a first threshold it can do nothing, as a reflection signal below that preset threshold should not harm the signal sources; if it is between a first threshold and a second threshold, the power levels at the signal sources can be reduced; and if it is above the second threshold the monitor can turn off the signal sources entirely. Without such a monitor, a high reflection signal could potentially travel through the F1 or F2 filters and damage their respective power amplifiers.

Although the present invention has been described above with particularity, this was merely to teach one of ordinary skill in the art how to make and use the invention. Many additional modifications will fall within the scope of the invention, as that scope is defined by the following claims.

APPENDIX A

Basic Program For Calculating High Order Responses that can be Received in a Receive Band Based on a Transmit Band

```
10 REM! BASIC LANGUAGE PROGRAM TO CALCULATE HIGH ORDER RESPONSES
20  DIM  N1W(101),N1F(101),D1(101),N2W(101),N2F
    (101),D2(101),N3W(101),N3F(101),D3(101),FTR(10),
    FT RL(10),FTRH(10),FDISPL(10),FDISPH(10),DRES
    (10)
30    FIF1=1070:FIF2=19.5:DF=2500:    FR=10000:R=4:
    D4PS=64:N=10
40 KEY OFF
50 CLS
60 INPUT "Input Frcv low (MHz)";FRCB
70 IF FRCB=0 THEN 980
80 INPUT "Input Frcv high (MHz)"; FRCE
90 IF FRCE=0 THEN 980
100 FRCBT=FRCB
110 IF FRCE<FRCB THEN FRCB+FRCE:FRCE=FRCBT
120 INPUT "Input Fxmt low (MHz)"; FTRB
130 IF FTRB=0 THEN 980
140 INPUT "Input Fxmt high (MHz)"; FTRE
150 FTRBT=FTRB
160 IF FTRE<FTRB then FTRB=FTRE:FTRE=FTRBT
170 IF FTRE=0 THEN 980
180 CLS
190 PRINT "Frcv low";FRCB
200 PRINT "Frcv high";FRCE
210 PRINT "Fxmt low":FTRB
220 PRINT "Fxmt high";FTRE
230 PRINT
240    FRCB=INT(0.5+FRCB*100):FRCE=INT(0.5+
    FRCE*100):FTRB=INT(0.5+FTRB*100):FTRE=INT
    (0.5+FTRE*100):REM! CONVERT TO 10 KHz RESOLUTION!
250 PRINT "Order Products FO1 FO2 high FO2 low FIN low FIN high Res Ft"
260                                                                      PRINT
"-----------------------------------------------------------------------------------"
270 FOR 1=2 TO 10
280 ORDL=100:ORDH=0:FIDSPL=2*FTRB:FDISHP=0
290 FOR FTR2=FTRE TO FTRB STEP -1
300 FTR1=FTRB
310 IF FRCB>FTRE TO FTR1+FTRE
320 FORD=I*FTR1-(I-1)*FTR2
330 ORD=2*I-1
340 IF  FORD>FRCB  AND  FORD<FRCE  THEN
    FDISP=FORD:GOTO 360
350 GOTO 380
360  IF  FDISP=<FDISPL  THEN  FDISPL=FDISP:
    FTRL=FTR2
370  IF  FDISP>=FDISPH  THEN  FDISPH=FDISP:
    FTRH=FTR2
380 NEXT FTR2
390 IF FDISPH=0 THEN 450
400 PRINT USING "##";ORD;I;I-1;
410 DRES=15000!*3*1.094*.9/(FDISPH-FDISPL)
420    FTR1(I)=FTR1:FTRL(I)=FTRL:FTRH(I)=FTRH:
    FDISPL(I)=FDISPL:FDISPH(I)=FDISPH
430  PRINT  USING   "####.##";FTR1/100;FTRL/100;
    FTRH/100;FDISPL/100;FDISPH/100
440 PRINT USING "##.#"; DRES
450 NEXT I
460 PRINT
470 INPUT "Input Order 3, 5, 7, . . . 19";ORD
480 ORD=INT(0.5+ORD)
490 IF ORD=0 THEN 980
500 IF ORD MOD 2=0 OR ORD<30R ORD>19 THEN
    GOTO 470
510 SEL=(ORD+1)/2
520 IF FTR1(SEL)=0 THEN 470
530 CLS
540 PRINT "Order Products FO1 FO2 high FO2 low FIN low FIN high Res Ft"
550                                                                      PRINT
"-----------------------------------------------------------------------------------"
560 PRINT USING "##";(s*SEL)-1;SEL;SEL-1;
570  PRINT  USING  "####.##";FTR1(SEL)/100;  FTRL
    (SEL)/100;   FTRH(SEL)/100;   FDISPL(SEL)/100;
    FDISPH(SEL)/100;
980 END
```

What is claimed:

1. An apparatus for determining the location and magnitude of one or more unknown passive intermodulation (PIM) sources along a transmission line at distances unknown relative to the test port, comprising:
a first signal source which outputs a first signal with a frequency of F1;
a second signal source which outputs a second signal with a frequency of F2;
a first signal combiner which combines the first signal and the second signal into a combined signal;
a coupler connected to an output of the first signal combiner, wherein the coupler transmits the combined signal to a test port, and extracts a portion of a reflected intermodulation signal (RIS) from the test port;

a signal port which provides a reference signal; and
a second signal combiner which
  receives the portion of the RIS from the coupler,
  receives the reference signal, and
  provides an output signal which is used to determine a distance to a PIM source.

2. The apparatus of claim 1 wherein the first signal combiner and coupling device are combined into a single five port module which includes:
  a first port that receives the first signal;
  a second port that receives the second signal;
  a third port connected to the coupler which extracts the portion of the RIS from the test port;
  a fourth port connected to a second coupler which extracts a portion of the combined signal for use in generating the reference signal; and
  a fifth port connected to the test port.

3. The apparatus of claim 1 wherein the first signal combiner and coupling device are combined into a single six port module which includes:
  a first port that receives the first signal;
  a second port that receives the second signal;
  a third port connected to the coupler which extracts the portion of the RIS from the test port;
  a fourth port connected to a second coupler which extracts a portion of the combined signal for use in generating the reference signal;
  a fifth port connected to the test port; and
  a sixth port connected to a third coupler which extracts a portion of a reflection signal from the test port to monitor the reflection signal.

4. The apparatus of claim 3 further comprising:
  a monitor, connected to the sixth port, which receives the portion of the reflection signal and shuts down the first and second signal sources if the portion of the reflection signal has a power level above a pre-set threshold.

5. An apparatus for determining the location and magnitude of one or more unknown passive intermodulation (PIM) sources along a transmission line at distances unknown relative to the test port, comprising:
  a first signal source which outputs a first signal with a frequency of F1;
  a second signal source which outputs a second signal with a frequency of F2;
  a module which connects the first signal source and the second signal source to a test port, wherein the module includes
    a first port which receives the first signal and a second port which receives the second signal, wherein the first signal and second signal are combined to create a combined signal,
    a third port which is connected to a first coupler which extracts a portion of a reflected intermodulation signal (RIS) from the test port,
    a fourth port which is connected to a second coupler which extracts a portion of the combined signal for use in generating a reference signal, and
    a fifth port connected to the test port;
  a signal port which provides the reference signal; and
  a second signal combiner which
    receives the portion of the RIS from the first coupler,
    receives the reference signal, and
    provides an output signal which is used to determine a distance to a PIM source.

6. The apparatus of claim 5 wherein the module further comprises:
  a sixth port connected to a third coupler which extracts a portion of a reflection signal from the test port to monitor the reflection signal.

7. The apparatus of claim 6 further comprising:
  a monitor, connected to the sixth port, which receives the portion of the reflection signal and shuts down the first and second signal sources if the portion of the reflected signal has a power level above a pre-set threshold.

8. An apparatus for determining the location and magnitude of one or more unknown passive intermodulation (PIM) sources along a transmission line at distances unknown relative to the test port, comprising:
  a first signal source which outputs a first signal with a frequency of F1;
  a second signal source which outputs a second signal with a frequency of F2;
  a six port module which connects the first signal source and the second signal source to a test port, wherein the six port module includes
    a first port which receives the first signal and a second port which receives the second signal, wherein the first signal and second signal are combined to create a combined signal,
    a third port which is connected to a first coupler which extracts a portion of a reflected intermodulation signal (RIS) from the test port,
    a fourth port which is connected to a second coupler which extracts a portion of the combined signal for use in generating a reference signal,
    a fifth port connected to the test port, and
    a sixth port connected to a third coupler which extracts a portion of a reflection signal from the test port to monitor the reflection signal;
  a signal port which provides the reference signal; and
  a second signal combiner which
    receives the portion of the RIS from the first coupler,
    receives the reference signal, and
    provides an output signal which is used to determine a distance to a PIM source.

9. The apparatus of claim 8 further comprising:
  a monitor, connected to the sixth port, which receives the portion of the reflection signal and shuts down the first and second signal sources if the portion of the reflection signal has a power level above a pre-set threshold.

* * * * *